United States Patent
Ooishi

(10) Patent No.: US 6,525,578 B2
(45) Date of Patent: Feb. 25, 2003

(54) PHASE-LOCK LOOP WITH INDEPENDENT PHASE AND FREQUENCY ADJUSTMENTS

(75) Inventor: Tsukasa Ooishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/987,261

(22) Filed: Nov. 14, 2001

(65) Prior Publication Data

US 2002/0030520 A1 Mar. 14, 2002

Related U.S. Application Data

(63) Continuation of application No. 09/130,606, filed on Aug. 7, 1998, now Pat. No. 6,337,589, which is a continuation-in-part of application No. 08/927,926, filed on Sep. 11, 1997, now abandoned.

(30) Foreign Application Priority Data

May 13, 1998 (JP) ............................................. 10-130546

(51) Int. Cl.$^7$ ............................................. H03L 7/06
(52) U.S. Cl. ..................... 327/156; 327/198; 327/544; 365/227
(58) Field of Search ................................. 327/156, 159, 327/142, 143, 147, 198, 544; 365/226, 227; 331/25

(56) References Cited

U.S. PATENT DOCUMENTS

| | | | |
|---|---|---|---|
| 4,069,462 A | 1/1978 | Dunn | 331/11 |
| 4,272,729 A | 6/1981 | Riley, Jr. | 331/1 A |
| 4,308,505 A | 12/1981 | Messerschmitt | 331/25 |
| 4,855,683 A | 8/1989 | Troudet et al. | 331/11 |
| 4,893,271 A * | 1/1990 | Davis et al. | 365/227 |
| 4,932,041 A | 6/1990 | Eiberger et al. | 331/11 |
| 5,304,953 A * | 4/1994 | Heim et al. | 331/1 A |
| 5,446,416 A | 8/1995 | Lin et al. | 331/11 |
| 5,619,161 A * | 4/1997 | Novof et al. | 327/535 |
| 5,739,709 A | 4/1998 | Banno | 331/11 |
| 6,031,429 A * | 2/2000 | Shen | 331/17 |
| 6,252,466 B1 * | 6/2001 | Kawamura | 331/25 |

FOREIGN PATENT DOCUMENTS

| JP | 5-315952 | 11/1993 |
|---|---|---|
| JP | 8-191247 | 7/1996 |

* cited by examiner

*Primary Examiner*—Tuan T. Lam
(74) *Attorney, Agent, or Firm*—McDermott, Will & Emery

(57) ABSTRACT

A PLL is provided with separate phase and frequency adjustment circuits to adjust the frequency of a produced internal clock independently from adjusting its phase. The phase adjustment circuit determines a phase error between the internal clock and an external clock, and averages the phase error over a predetermined time period to produce the corresponding control current. The frequency adjustment circuit detects the difference between the frequency of the internal clock and the frequency of the external clock to determine a frequency error. An accumulator accumulates the frequency error during the predetermined time period to produce the corresponding control current. Based on values of the control currents produced by the phase and frequency adjustment circuits, a current calculator calculates a resulting value of the control current to be applied to a CCO to modify its frequency so as reduce the frequency and phase differences.

21 Claims, 18 Drawing Sheets

RING OSCILLATOR

PHASE-LOCK LOOP WITH INDEPENDENT PHASE AND FREQUENCY ADJUSTMENTS

This application is a continuation of U.S. patent application Ser. No. 09/130,606, filed Aug. 7, 1998, now U.S. Pat. No. 6,337,589, which is a continuation-in-part of U.S. patent application Ser. No. 08/927,926, filed Sep. 11, 1997, now abandoned.

TECHNICAL FIELD

The present invention relates to a phase-lock loop (PLL), and more particularly, to a PLL with independent phase and frequency adjustment circuits that may be used in synchronous memory devices.

BACKGROUND ART

An external signal supplied to an electrical system is inevitably corrupted by additive noise. For various applications, such as clock generation, a highly stable signal is required. Therefore, the external signal should be processed to remove as much noise as possible.

To produce a stable internal signal based on the external signal, a conventional PLL may employ a current-controlled oscillator (CCO), whose frequency is controlled by a control current. A phase detector compares the phase of the external signal against the phase of the CCO output to determine an error signal that indicates the phase difference. To suppress noise, the error signal is averaged over some length of time, and the average value is used to produce the control current applied to the CCO to change its frequency in a direction that reduces the phase difference between the input signal and the CCO output.

Referring to FIG. 1, a conventional PLL 30 for producing a highly accurate internal clock INT.CLK based on an external reference clock EXT.CLK may comprise a phase detector 32 supplied with the EXT.CLK signal. Via a charge pump 34, a loop filter 36, and a voltage-to-current transformer 38, the output of the phase detector 32 is coupled to a control input of a CCO 40. A level shifting and buffering circuit 42 coupled to the CCO output produces the INT.CLK signal supplied via a feedback loop to the phase detector 32.

The phase detector 32 compares the phase $\Phi int$ of the INT.CLK signal with the phase $\Phi ext$ of the EXT.CLK signal to generate a phase error voltage $Vd=Kc(\Phi ext-\Phi int)$, where Kc is called the phase detector gain factor and is measured in units of volts per radian. The gain factor Kc is determined by the charge pump 34 used to charge and discharge the loop filter 36.

The phase error voltage Vd is filtered by the loop filter 36 that suppresses noise and high-frequency components of the phase error signal. The voltage-to-current transformer 38 converts the filtered phase error voltage into control current that defines the frequency of the CCO 40. The level shifting and buffering circuit 42 translates the level of the CCO output into a level required for a system supplied with the INT.CLK signal, and provides an interface between the PLL and this system.

When the loop is locked, the control current is such that the frequency of the CCO is equal to the average frequency of the EXT.CLK signal. For each cycle of the EXT.CLK signal there is one, and only one, cycle of the CCO output. To maintain the control current needed for lock, it is generally necessary to have a nonzero output from the phase detector. Consequently, the loop operates with some phase error present.

Since frequency is the derivative of phase, a conventional PLL performs frequency adjustment of an incoming signal simultaneously with adjustment of its phase. The frequency and phase adjustments are carried out using the phase detector 32 which performs phase comparison at the frequency of the CCO output signal supplied via the feedback loop. The error signal at the output of the phase detector 32 indicates instantaneous phase difference. The loop filter 36 provides averaging of the error signal over some time interval to establish an average value used for producing the control current applied to the CCO 40. Deviation of the CCO from its center frequency caused by the control current may be described as $d\Phi_0/dt$, where $\Phi_0$ is the phase of the CCO output equal to the phase $\Phi int$ of the INT.CLK signal produced by the PLL 30. In other words, a conventional PLL performs frequency and phase adjustments in the same loop.

A PLL starts out in an unlocked condition and must be brought into lock. The process of bringing a conventional PLL into lock is often a slow and unreliable process performed by the phase detector 32 that tracks variations of the INT.CLK signal with respect to the reference EXT.CLK signal. In particular, when the INT.CLK signal leads in phase with respect to the EXT.CLK signal, or the frequency of the INT.CLK signal is higher than the frequency of the EXT.CLK signal, the phase detector 32 causes the charge pump 34 to increase the potential at the output of the loop filter 36. In response, the voltage-to-current transformer 38 reduces the value of the control current applied to the CCO 40. As a result, the frequency of the INT.CLK signal at the output of the CCO 40 reduces. The reduction of the INT.CLK frequency causes the delay of the INT.CLK signal to reduce its phase lead with respect to the EXT.CLK signal.

By contrast, when the INT.CLK signal lags in phase with respect to the EXT.CLK signal, or the frequency of the INT.CLK signal is lower than the frequency of the EXT-.CLK signal, the phase detector 32 causes the charge pump 34 to reduce the potential at the output of the loop filter 36. In response, the voltage-to-current transformer 38 increases the value of the control current applied to the CCO 40. When the control current increases, the frequency of the INT.CLK signal at the output of the CCO 40 increases. The INT.CLK frequency increase causes the INT.CLK signal to reduce its phase lag with respect to the EXT.CLK signal.

However, in conventional PLLs, it takes a long time to reach a locked state when the frequency of the INT.CLK signal becomes close to the frequency of the EXT.CLK signal. It would be desirable to provide a PLL that reduces the time required to bring the loop into a locked state.

If the INT.CLK frequency is dose enough to the EXT-.CLK frequency, a conventional PLL locks up with just a phase transient. There is no cycle slipping prior to lock. It would be desirable to provide a PLL that operates in a wide frequency range over which the loop could be brought into a locked state without slipping cycles.

A small phase error enables a PLL to maintain a locked state. However, if the error becomes so large that the CCO skips cycles, the PLL is considered to have lost lock. A recovery time is required to acquire lock again. It would be desirable to provide a PLL that requires a short recovery time.

DISCLOSURE OF THE INVENTION

Accordingly, one advantage of the present invention is in providing a PLL that reduces the time required to bring its loop into a locked state, compared to a conventional PLL.

Another advantage of the present invention is in providing a PLL that operates in a wide frequency range over which its loop can be brought into a locked state without slipping cycles.

A further advantage of the present invention is in providing a PLL that requires a short recovery time.

The above and other advantages of the invention are achieved, at least, in part, by providing a system for generating an internal clock signal in response to an external dock signal. The system comprises a phase adjustment circuit responsive to the external dock signal and the internal dock signal for producing a phase adjustment signal that represents difference between the phase of the external clock signal and the phase of the internal dock signal. A frequency adjustment circuit is responsive to the external clock signal and the internal clock signal for producing a frequency adjustment signal that represents difference between the frequency of the external dock signal and the frequency of the internal dock signal. A control value calculator is responsive to the phase adjustment signal and the frequency adjustment signal for producing a resulting control signal supplied to a signal-controlled oscillator that generates the internal clock signal at an internal dock frequency deviating in response to the resulting control signal.

In accordance with a first embodiment of the present invention, the frequency adjustment circuit may comprise a frequency detector responsive to the external and internal dock signals for producing an instantaneous value of a frequency error signal that indicates difference between instantaneous frequencies of the internal clock signal and the external dock signal. An accumulator may be coupled to the frequency detector for accumulating instantaneous values of the frequency error signal over a preset time period to produce an accumulated signal that indicates an average value of the frequency difference for the preset time period. An adjusting circuit may be coupled to the accumulator for adjusting the accumulated signal to produce the frequency adjustment signal.

In accordance with another embodiment of the present invention, the frequency adjustment circuit may comprise a first counter responsive to the external dock signal and the internal dock signal for counting the number of periods of the external dock signal in a half cycle of the internal dock signal in which the internal dock signal is at a first logic level. A second counter may count the number of periods of the external dock signal in a half cycle of the internal dock signal in which the internal clock signal is at a second logic level. A third counter may count the number of periods of the internal clock signal in a half cycle of the external dock signal in which the external clock signal is at the first logic level. Finally, a fourth counter may count the number of periods of the internal clock signal in a half cycle of the external clock signal in which the external clock signal is at the second logic level.

First, second, third and fourth adders may be respectively coupled to the first, second, third and fourth counters for accumulating n-bit counts produced by the first, second, third and fourth counters to generate m-bit accumulated values. First, second, third and fourth decoders may be respectively coupled to the first, second, third and fourth adders to generate first, second, third and fourth frequency control values supplied, together with a base value representing the phase adjustment signal, to the control value calculator. In response, the control value calculator may add the first or second frequency control values to the base value, or subtract the third or fourth frequency control values from the base value.

A reference current generator may be provided for supplying the first, second, third and fourth decoders with reference current to present the first, second, third and fourth frequency control values as first, second, third and fourth frequency control currents. The base value may be represented by base current. In response to the first, second, third and fourth frequency control currents and the base current, the control value calculator may produce the resulting control current supplied to the signal-control oscillator to adjust frequency and phase of the internal clock signal.

In accordance with a further embodiment of the present invention, the frequency adjustment circuit may comprise a first frequency divider supplied with the internal clock signal for producing a divided internal clock signal at a frequency equal to the frequency of the internal clock signal divided by a preset number. A second frequency divider may be supplied with the external clock signal for producing a divided external clock signal at a frequency equal to the frequency of the external clock signal divided by the preset number.

A first counter may be coupled to the first frequency divider and supplied with the external dock signal for counting the number of periods of the external clock signal in a half cycle of the divided internal dock signal. A second counter may be coupled to the second frequency divider and supplied with the internal dock signal for counting the number of periods of the internal dock signal in a half cycle of the divided external clock signal.

First and second adders may be respectively coupled to the first and second counters for accumulating n-bit counts produced by the first and second counters to generate m-bit accumulated values. First and second decoders may be respectively coupled to the first and second adders to generate first and second frequency control values supplied to the control value calculator. In response, the control value calculator may add the first frequency control value to the base value, or subtract the second frequency control value from the base value.

In accordance with another embodiment of the present invention, a fine adjustment circuit may be provided for fine frequency tuning of the signal-controlled oscillator, in addition to rough frequency adjustment carried out by the frequency adjustment circuit, and phase adjustment provided by the phase adjustment circuit. The fine adjustment circuit may comprise a delay monitor for delaying the external dock signal by a delay amount defined by a period of the signal-controlled oscillator. A comparator may compare a delayed external clock signal produced by the delay monitor with the external dock signal to generate a fine control signal supplied to the control value calculator to modify the resulting control signal.

In accordance with a further embodiment of the present invention, the fine adjustment circuit may comprise a delay model responsive to the external clock signal for producing a first output signal delayed by a first delay time smaller than a period of the signal-controlled oscillator, and for producing a second output signal delayed by a second delay time larger than the period of the signal-controlled oscillator.

A logic circuit may be coupled to the delay model and supplied with an input signal to the delay model for determining logic levels of the first and second output signals when the input signal goes from a first level to a second level. The logic circuit may produce a down signal when both the first and second output signals are at the first level. An up signal may be produced when both the first and second output signals are at the second level when said input signal goes from the first level to the second level. The control value calculator may increase a value of the resulting control signal in response to the up signal, or decrease the value of the resulting control signal in response to the down signal.

A frequency divider may be coupled to the delay model for producing its input signal at a frequency equal to the frequency of the external clock signal divided by a predetermined amount.

A first adder may be coupled to the logic circuit for accumulating instantaneous values of the up signal to generate an m-bit accumulated value of the up signal. A second adder may be coupled to the logic circuit for accumulating instantaneous values of the down signal to generate an m-bit accumulated value of the down signal. First and second decoders may be respectively coupled to the first and second adders to generate first and second fine tuning values supplied to the control value calculator. In response, the control value calculator may add the first fine tuning value to the base value, or subtract the second fine tuning values from the base value.

The signal-controlled oscillator may comprise a ring oscillator having k serially connected inverter stages, where k is an odd number. The delay model may comprise more than 2k serially connected delay stages similar to the inverter stages in the ring oscillator. The first output signal may be produced at an output of delay stage 2k−l, where l is an integer. For example, l may equal to 1. The second output signal may be produced at an output of delay stage 2k+l.

Also, the fine adjustment circuit may comprise a reference current generator for supplying the first and second decoders with reference current to present the first and second fine tuning values as first and second fine tuning currents. The control value calculator may produce resulting control current supplied to the ring oscillator to tune its frequency.

In accordance with a method of the present invention, to produce an internal clock signal in synchronism with an external clock signal, the following steps are carried out:

comparing phase of the internal clock signal with phase of the external clock signal to produce a phase adjustment signal representing differences in phase and frequency between the internal clock signal and the external clock signal, comparing frequency of the internal clock signal with frequency of the external clock signal independently from the step of phase comparing, to produce a frequency adjustment signal representing difference between the frequency of the internal clock signal and the frequency of the external clock signal, producing a control signal representing the phase adjustment signal and the frequency adjustment signal, and controlling a signal-controlled oscillator by the control signal to produce the internal control signal synchronized with the external control signal.

The steps of phase comparing and frequency comparing may be carried out by separate circuits.

Further, fine tuning of the signal-controlled oscillator may be carried out when the frequency of the internal clock signal is close to the frequency of the external clock signal. The step of fine tuning may comprise the step of delaying the external clock signal by a delay time defined by a period of the signal-controlled oscillator. A delayed external clock signal may be compared with the external clock signal to produce a fine tuning signal. The resulting control signal may be produced so as to represent the phase adjustment signal, the frequency adjustment signal and the fine tuning signal.

In accordance with another aspect of the present invention, a memory device supplied with an external clock signal comprises:

a memory cell array for storing data, and an internal synchronous clock signal generator responsive to the external dock signal for producing an internal clock signal supplied to internal circuits of the memory device to control various data reading and writing operations.

The internal synchronous dock signal generator includes:

a phase adjustment circuit responsive to the external clock signal and the internal clock signal for producing a phase adjustment signal representing difference between phase of the external clock signal and phase of the internal clock signal, a frequency adjustment circuit responsive to the external clock signal and the internal clock signal for producing a frequency adjustment signal representing difference between frequency of the external clock signal and frequency of the internal clock signal, a control value calculator responsive to the phase adjustment signal and the frequency adjustment signal for producing a resulting control signal, and a signal-controlled oscillator responsive to the resulting control signal for supplying the internal circuits with the internal clock signal modified in response to the resulting control signal.

Still other advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BEST MODE FOR CARRYING OUT THE INVENTION

Figure 1:
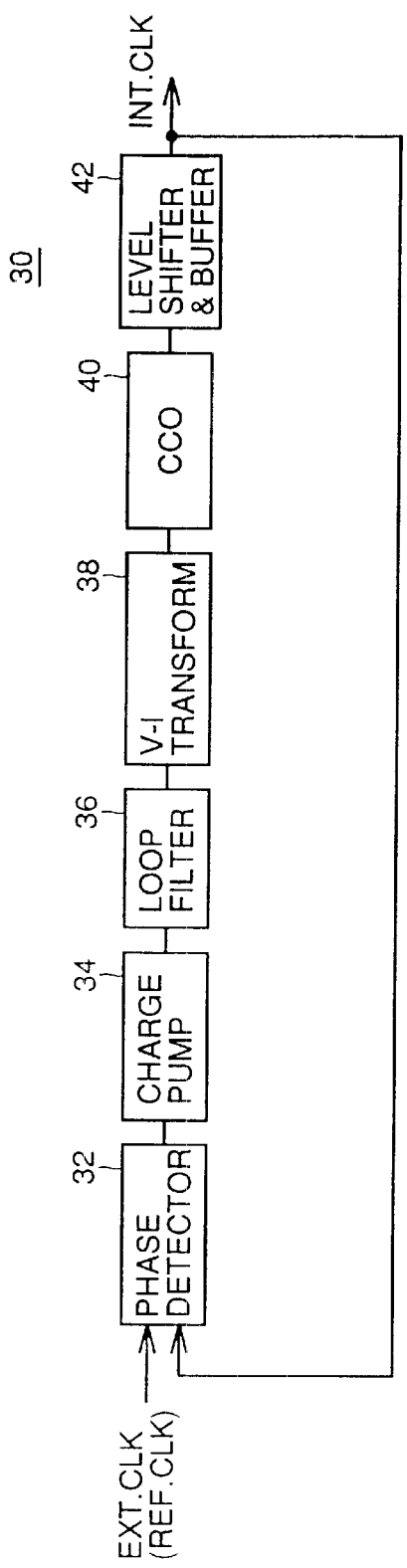
FIG. 1 illustrates a conventional PLL.
Figure 2:
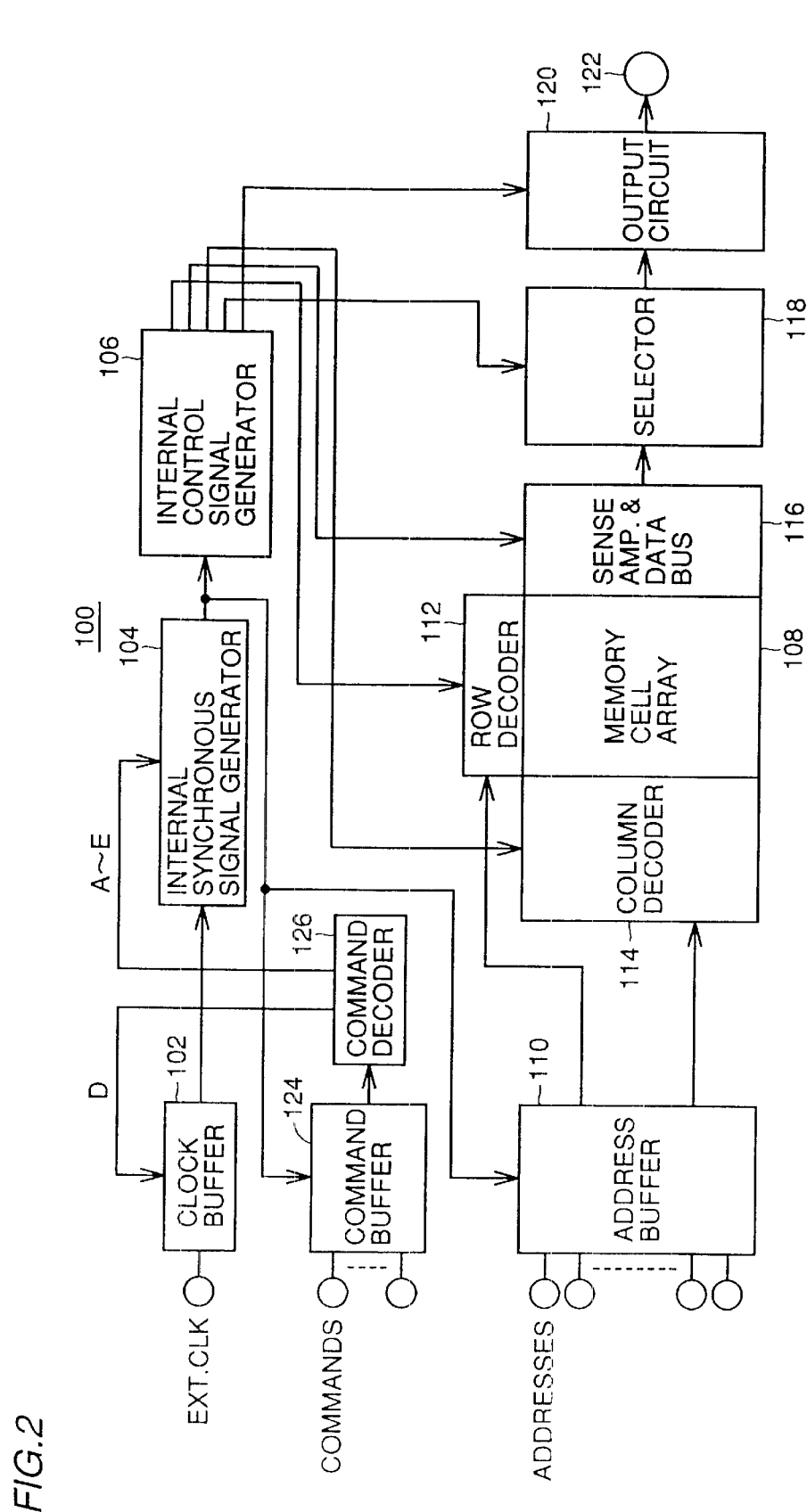
FIG. 2 shows a schematic block diagram of an exemplary system in which a PLL of the present invention may be employed.

Reference is now made to FIG. 2 that shows a schematic block diagram of an exemplary system in which the present invention may be advantageously employed. The exemplary system is a synchronous semiconductor memory device 100, such as synchronous dynamic random-access memory (SDRAM), synchronized by clock signals to reduce the memory access time. The memory device 100 may comprise a clock buffer 102 supplied with an external clock signal EXT.CLK. Via the clock buffer 102, the EXT.CLK signal is sent to an internal synchronous signal generator 104 which contains a PLL for producing an internal dock signal INT.CLK. An internal control signal generator 106 uses the INT.CLK signal received from the internal synchronous signal generator 104 to generate internal control signals for controlling various memory operations.

The synchronous memory device 100 contains a memory cell array 108 having memory cells arranged in rows and columns. An address buffer 110 supplied with the INT.CLK signal receives external address signals to produce an internal row address signal and an internal column address signal.

A row decoder 112 is controlled by the internal control signal from the internal control signal generator 106 to decode the internal row address signal and select a corresponding row in the memory cell array 108. A column decoder 114 is controlled by the internal control signal from the internal control signal generator 106 to decode the internal column address signal that enables the column decoder 114 to simultaneously select a plurality of columns in the memory cell array 108 and sense amplifiers 116 connected to the selected columns to read and amplify data stored in the memory cells coupled to the selected row.

The sense amplifiers 116 controlled by the internal control signal from the internal control signal generator 106 connects the selected columns to an internal data bus in response to a column select signal from the column decoder 114. A selector circuit 118 controlled by the internal control signal from the internal control signal generator 106 selects data corresponding to an internal select address signal supplied from the address buffer 110. An output circuit 120 is controlled by the internal control signal generator 106 to supply the selected data to a data input/output terminal 122.

External command signals are supplied via a command buffer 124 to a command decoder 126 which decodes the external commands to generate command docks A–E for controlling the dock buffer 102 and various elements of the PLL in the internal synchronous signal generator 104 to produce the INT.CLK signal, as disclosed in more detail later.

Accordingly, operations of the synchronous memory device 100 are synchronized using the internal clock signal INT.CLK produced by the PLL in the internal synchronous signal generator 104 in response to the external dock signal EXT.CLK.

Figure 3:
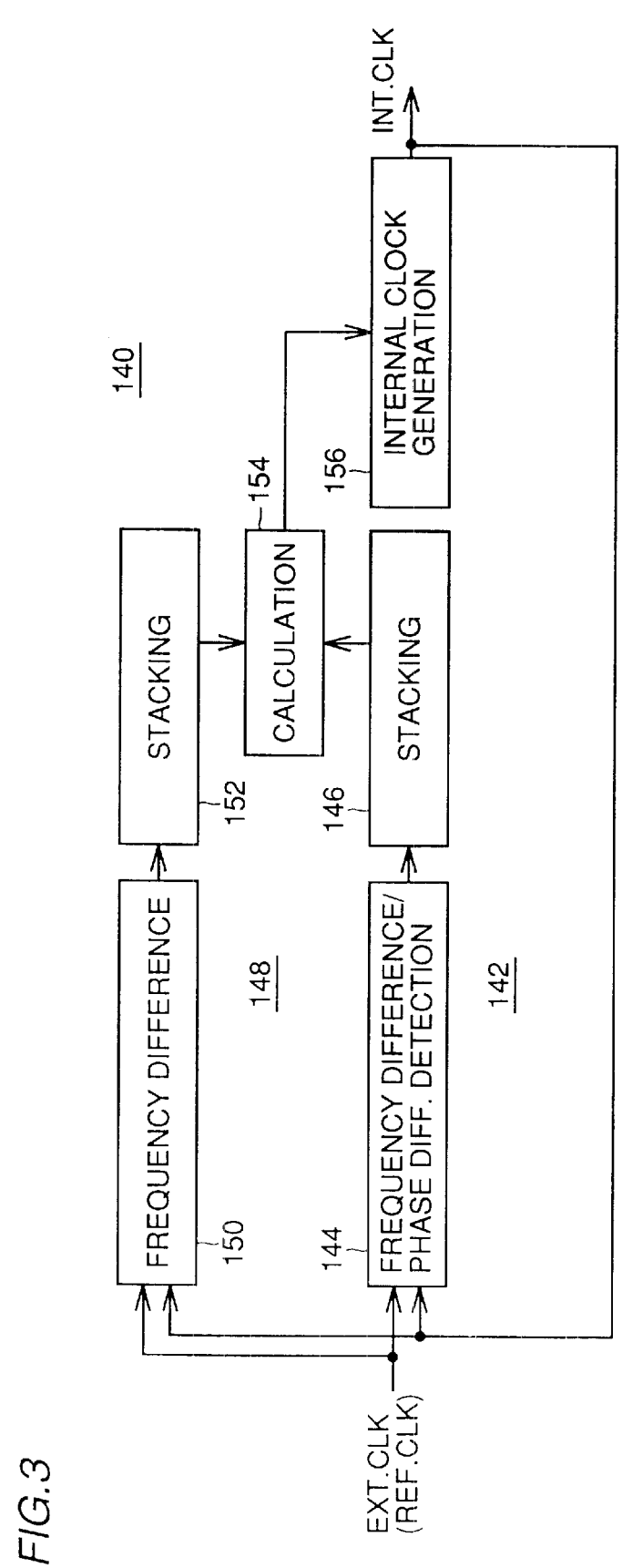
FIG. 3 illustrates independent phase and frequency adjustments in the PLL of the present invention.

Referring to FIG. 3, a PLL 140 of the present invention employs two separate circuits to adjust the frequency of the internal dock INT.CLK independently from adjusting the phase of the internal clock. In a phase adjustment circuit 142, the PLL 140 detects the phase difference and frequency difference between the internal clock INT.CLK and the external clock EXT.CLK to determine a phase error (step 144). In stacking step 146, the phase error is averaged over a predetermined time period, and its average value may be used to produce the control current that reflects the detected phase difference and frequency difference.

In a frequency adjustment circuit 148, the PLL 140 detects the difference between the frequency of the INT.CLK signal and the frequency of the EXT.CLK signal to determine a frequency error (step 150). Then, stacking step 152 is carried out to average the frequency error over the predetermined time period. The produced average value may indicate the control current corresponding to the detected frequency difference.

In step 154, the values produced in steps 146 and are used to calculate a value of the resulting control current to be applied to a CCO to modify its frequency so as to reduce the frequency difference detected in step 150, and the phase and frequency differences detected in step 144. The calculation of the resulting control current is carried out in accordance with the preset algorithm. In step 156, the CCO frequency deviates in response to the calculated value of the control current so as to reduce the frequency difference between the internal and external docks.

When the external reference dock EXT.CLK is first applied, the frequency difference between the external and internal docks may be so large that the PLL 140 is out of lock. In this case, the frequency adjustment circuit 148 operates in a mode of rough adjustment to bring the CCO frequency closer to the frequency of the external clock. The operation in the rough adjustment mode is carried out until the lock limit is reached, i.e. until the INT.CLK frequency is close enough to the EXT.CLK frequency to bring the loop into lock. The phase adjustment circuit 142 has little effect when the system 140 is out of lock. The CCO is controlled almost exclusively by the frequency adjustment circuit 148.

When the frequency adjustment circuit 148 brings the frequency error within the lock limit, the locking system 140 goes to a locked mode of operation to perform accurate phase and frequency adjustment. In this mode, the phase adjustment circuit 142 dominates over the frequency adjustment circuit 148 because of the phase-integrating property of the CCO.

Figure 4:
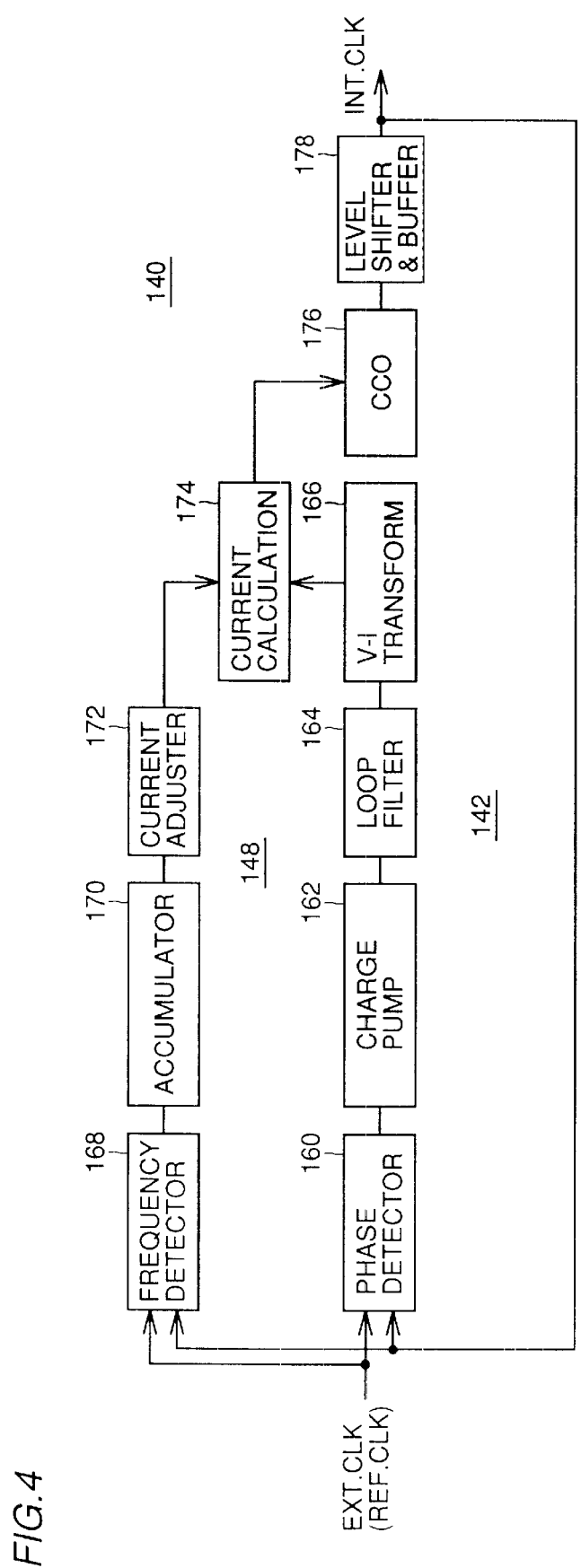
FIG. 4 is a simplified block diagram of the PLL having a phase adjustment circuit and a frequency adjustment circuit.

Referring to FIG. 4, the phase adjustment circuit 142 of the PLL 140 may comprise a phase detector 160 having a first input supplied with the external reference clock EXT.CLK. The internal clock INT.CLK is fed to a second input of the phase detector via a feedback loop. The phase detector compares the phase of the INT.CLK signal with the phase of the EXT.CLK signal. Since frequency is the derivative of phase, the phase detector simultaneously compares the frequency of the INT.CLK signal with the frequency of the EXT.CLK signal. The output of the phase detector 160 produces a phase error signal indicating instantaneous phase and frequency difference between the INT.CLK signal and the EXT.CLK signal.

A charge pump 162 is coupled to the output of the phase detector 160 for charging or discharging a loop filter 164 connected to the charge pump 162. The loop filter 164 filters the phase error signal to suppress noise and eliminate high-frequency components by averaging the value of this signal for a predetermined period of time. In other words, the input to the loop filter 164 is a noisy signal, whereas the output is a cleaned-up version of the phase error signal.

Two important characteristics of the loop filter 164 are that its bandwidth is narrow enough to reject large amounts of noise, and that the loop filter 164 automatically tracks the error signal frequency when the loop is locked. A voltage-to-current transformer 166 may be coupled to the output of the loop filter 166 to convert its voltage into a base current that corresponds to the phase and frequency difference between the INT.CLK and EXT.CLK signals.

When the INT.CLK signal leads in phase with respect to the EXT.CLK signal, or the frequency of the INT.CLK signal is higher than the frequency of the EXT.CLK signal, the phase detector 160 causes the charge pump 162 to increase the potential at the output of the loop filter 164. In response, the voltage-to-current transformer 166 reduces the value of the base current.

By contrast, when the INT.CLK signal lags in phase with respect to the EXT.CLK signal, or the frequency of the INT.CLK signal is lower than the frequency of the EXT.CLK signal, the phase detector 160 causes the charge pump 162 to reduce the potential at the output of the loop filter 164. In response, the voltage-to-current transformer 166 increases the value of the base current.

The frequency adjustment circuit 148 of the PLL 140 may contain a frequency detector 168, an accumulator 170 and a current adjuster 172. The frequency detector 168 has its first input supplied with the external reference clock EXT.CLK, and its second input provided with the internal clock INT.CLK via a feedback loop. The output of the frequency detector 168 produces an instantaneous value of a frequency error signal indicating difference between the instantaneous frequencies of the INT.CLK signal and the EXT.CLK signal.

The accumulator 170 accumulates instantaneous values of the frequency error signal over a preset time period to produce an output current indicating an average value of the frequency difference for the preset time period. The current adjuster 172 adjusts the current supplied from the accumulator 170 to produce a control current representing the frequency error.

A current calculator 174 adds or subtracts the control current value produced by the current adjuster 172 to or from the base current value produced by the voltage-to-current transformer 166, depending on whether the frequency difference between the EXT.CLK and INT.CLK signals is considered to be a positive or negative value. A CCO 176 has its control input connected to the output of the current calculator 174. For example, a ring oscillator having an odd number of inverter stages may be used as the CCO 176.

When the external reference clock EXT.CLK is first applied, the frequency of the CCO 176 may be determined by the base current produced by the voltage-to-current transformer 166 in the phase adjustment circuit 142. If the PLL 140 is out of lock, the frequency adjustment circuit 148 operates in a mode of rough adjustment to bring the CCO frequency closer to the frequency of the external clock EXT.CLK. The rough adjustment mode of operation is carried out until the lock limit is reached. The phase adjustment circuit 142 has little effect when the system 140 is out of lock. The deviation of the CCO frequency is determined almost exclusively by the control current produced by the current adjuster 174 in the frequency adjustment circuit 148. The resulting current produced by the current calculator 174 is applied to the control input of the CCO 176. When the value of the resulting current decreases, the frequency at the output of the CCO 176 reduces. When the value of the resulting current increases, the CCO frequency increases.

When the frequency adjustment circuit 148 makes the difference between the CCO frequency and the EXT.CLK frequency small enough to bring the frequency error within the lock limit, the PLL 140 goes to a locked mode of operation to perform accurate phase and frequency adjustment. In this mode, the base current produced in the phase adjustment circuit 142 dominates over the control current produced in the frequency adjustment circuit 148 because of the phase-integrating property of the CCO 176.

A level shifting and buffering circuit 178 coupled to the output of the CCO 176 produces the INT.CLK signal supplied via a feedback loop to the phase detector 160 and the frequency detector 168. The level shifting and buffering circuit 178 translates the level of the CCO output into a level required for a system supplied with the INT.CLK signal, and interfaces the PLL 140 with this system.

Due to employing the frequency adjustment circuit 148 in addition to the phase adjustment circuit 142, frequency adjustment is carried out independently of phase adjustment. This allows the PLL 140 of the present invention to reach a locked state substantially faster than a conventional PLL. As a result, the present invention allows substantially to reduce a transitional time period from the instant, in which the EXT.CLK signal is first applied to the instant, in which the INT.CLK signal becomes synchronized with the EXT.CLK signal.

Also, the frequency adjustment circuit 148 reduces the recovery time required for the PLL 140 to reinstate a locked state after going out of lock, compared to a conventional PLL.

Moreover, the detection of the EXT.CLK and INT.CLK frequency difference using the frequency detector 168 enables the PLL 140 to substantially increase a frequency range, within which lock-in operations may be performed, compared to a conventional PLL.

Figure 5:
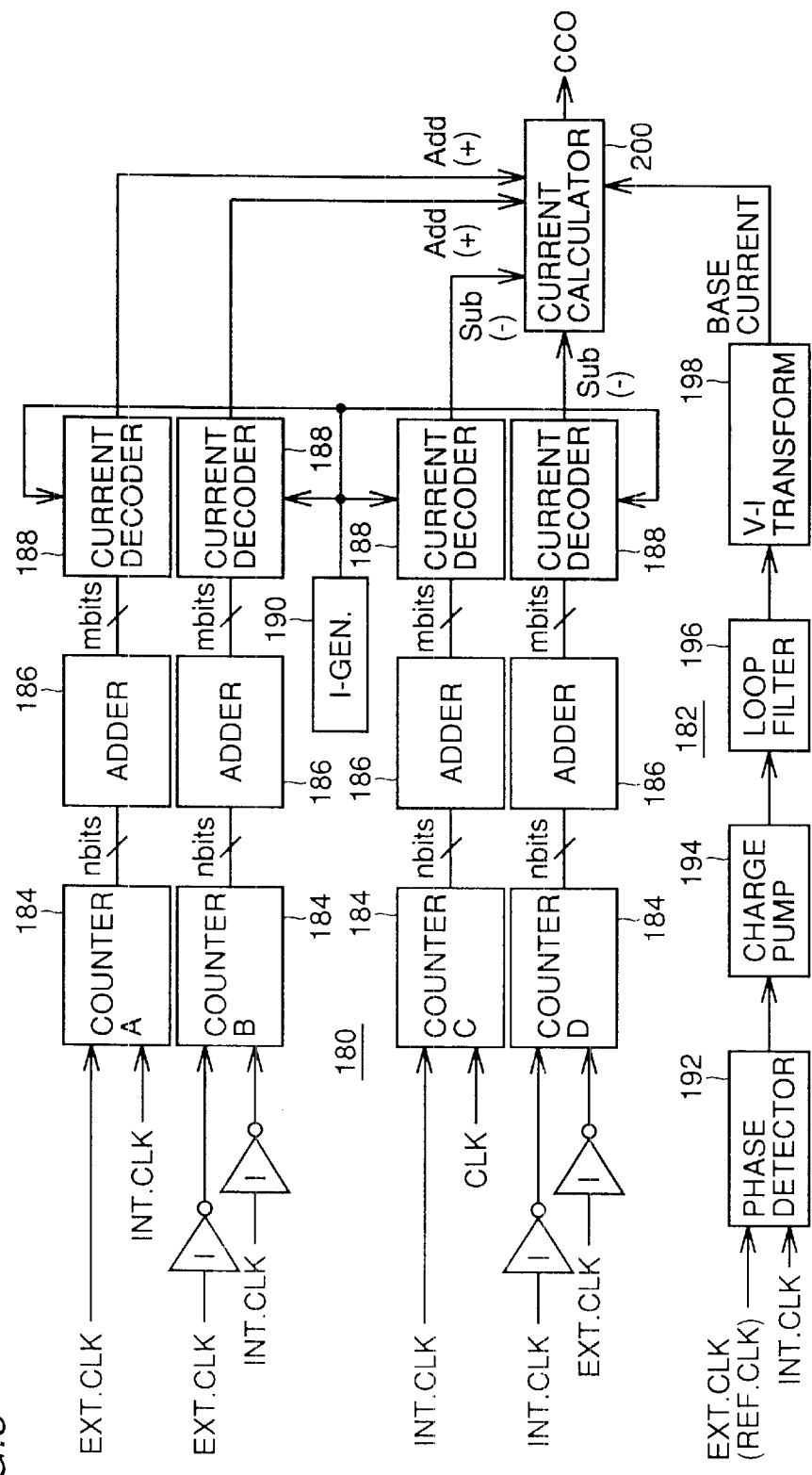
FIG. 5 illustrates an embodiment of the present invention having a plurality of counters in the frequency adjustment circuit.

FIG. 5 illustrates an exemplary embodiment of the PLL that employs a frequency adjustment circuit 180 in addition to a phase adjustment circuit 182. The frequency adjustment circuit 180 may comprise four counters A, B, C and D labelled by reference number 184. Each of the counters 184 is supplied with an external reference clock EXT.CLK, and an internal clock INT.CLK, or with a reference clock EXT.CLK/ inverted with respect to the EXT.CLK signal, and an internal clock INT.CLK/ inverted with respect to the INT.CLK signal. As discussed above, the INT.CLK signal is provided from the output of the PLL via a feedback loop.

The counters 184 count the number of clocks in the EXT.CLK and INT.CLK signals, and produce n-bit counts representing the result of their counting operations. For example, the counter A may be used for counting the number of EXT.CLK periods in a high-level half cycle of the INT.CLK signal. The counter B may count the number of EXT.CLK periods in a low-level half cycle of the INT.CLK signal. The counter C may count the number of INT.CLK periods in a high-level half cycle of the EXT.CLK signal. Finally, the counter D may me used for counting the number of INT.CLK periods in a low-level half cycle of the EXT.CLK signal. In this case, counters B and D are supplied with the EXT.CLK/ and INT.CLK/ signals produced by inverters I coupled to the inputs of the counters B and D.

An adder 186 is coupled to the output of each counter 184 for accumulating the n-bit counts produced by the corresponding counter 184 to generate an m-bit value. A current decoder 188 is coupled to the output of each adder 186 for producing the control current that represents the output value of the corresponding adder 186.

A current generator 190 provides each of the current decoders 180 with a reference value of current. The current decoders 180 modify the reference current in accordance with the output values of the corresponding adders 186 to produce the control current.

The phase adjustment circuit 182 may comprise a phase detector 192 supplied with the EXT.CLK signal and the INT.CLK signal to produce a phase error signal representing phase and frequency differences between the EXT.CLK signal and the INT.CLK signal. The phase error signal is processed by a charge pump 194, a loop filter 196 and a voltage-to-current transformer 198 to produce a base current corresponding to the phase error signal. The elements of the phase adjustment circuit 182 operate similarly to the corresponding elements of the phase adjustment circuit 142 discussed above in connection with FIGS. 3 and 4.

A current calculator 200 is coupled to the outputs of the current decoders 188 and the voltage-to-current transformer 198 to add the value of the control current produced by the current decoders 188 to the value of the base current, or to subtract the value of the control current from the value of the base current. For example, the values produced by the current decoders 188 corresponding to the counters A and B are added to the value of the base current, whereas the values produced by the current decoders 188 corresponding to the counters C and D are subtracted from the value of the base current.

The current calculator 200 produces resulting current supplied to a control input of a CCO, such as a ring oscillator. When the EXT.CLK signal is first applied, the CCO frequency is determined by the base current. In response to the resulting current from the current calculator 200, the CCO frequency deviates so as to reduce phase and frequency difference between the EXT.CLK and INT.CLK signals. The CCO output signal may be processed by a level shifting and buffering circuit to produce the INT.CLK signals.

Figure 6:
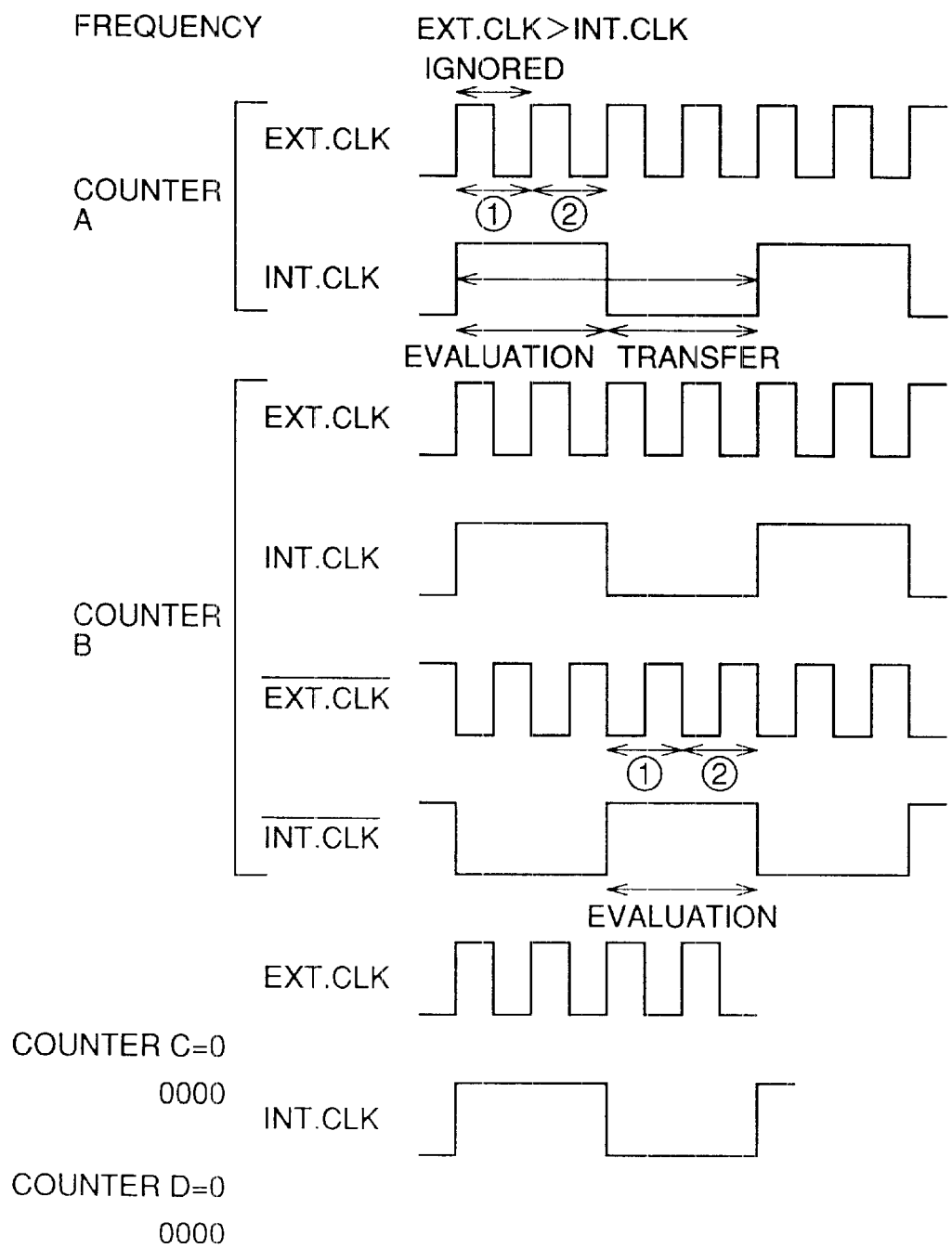
FIGS. 6 and 7 show waveforms illustrating operations of the frequency adjustment circuit in FIG. 5.

When the PLL is out of lock, the frequency adjustment circuit 180 operates in a mode of rough adjustment to bring the INT.CLK frequency at the CCO output closer to the frequency of the external clock EXT.CLK. As illustrated in FIG. 6, when the EXT.CLK frequency is higher than the INT.CLK frequency, the counter A counts the number of the EXT.CLK periods in a high-level half period of the INT.CLK signal. To determine the number of the EXT.CLK periods in a low-level half period of the INT.CLK signal, the counter B may count the number of periods of the EXT.CLK/ signal in a high-level half period of the INT.CLK/ signal. The counters A and B may ignore the first period of the EXT.CLK and EXT.CLK/ signals in a high-level half cycle of the INT.CLK and INT.CLK/ signals, and produce their counts only in response to the EXT.CLK and EXT.CLK/ periods that follow the first period.

A high-level half cycle of the INT.CLK and INT.CLK/ signals defines an evaluation period of counting for the counters A and B, respectively. The evaluation period is followed by a transfer period defined by the next low-level half cycle of the INT.CLK and INT.CLK/ signals. During the evaluation period, the counters A and B produce their output counts. During the transfer period, the produced counts are accumulated by the corresponding adders 186.

Thus, when two or more EXT.CLK or EXT.CLK/ periods are detected in a high-level half cycle of the INT.CLK or INT.CLK/ signal, the counters A and B produce the corresponding counts represented by n-bit values. In the example illustrated in FIG. 6, each of the counters A and B detects two EXT.CLK periods. Accordingly, their counts are equal to 1, and may be represented by 0001. However, the counters C and D produce no counts because the EXT.CLK frequency is higher than the INT.CLK frequency.

The adders 186 coupled to the counters A and B accumulate the n-bit counts produced during a predetermined number of INT.CLK or INT.CLK/ half cycles to generate the corresponding m-bit values. The current decoders 188 corresponding to the counters A and B produce the control current having values representing the m-bit values produced by the adders 186. These control current values are added to the value of the base current to increase the current supplied to the CCO. In response, the CCO frequency increases to increase the INT.CLK frequency so as to make the INT.CLK frequency closer to EXT.CLK frequency.

Figure 7:
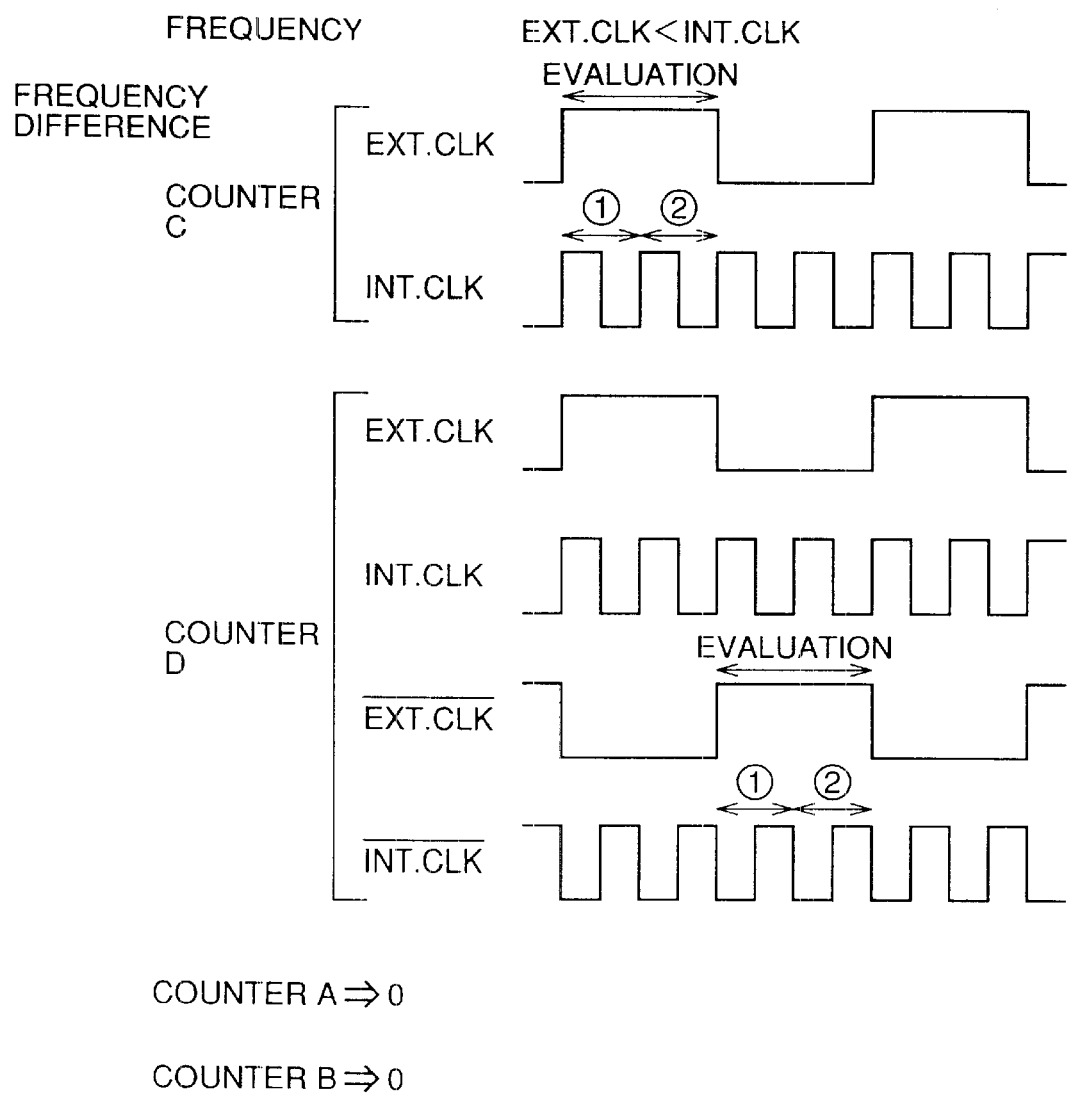

As illustrated in FIG. 7, when the EXT.CLK frequency is lower than the INT.CLK frequency, the counters A and B produce no counts. However, the counters C and D respectively count the number of INT.CLK periods in high-level and low-level half cycles of the EXT.CLK signal. To obtain the required count, the counter D may count the number of INT.CLK/ periods in a high-level half cycle of the EXT.CLK/ signal.

A high-level half cycle of the EXT.CLK and EXT.CLK/ signals defines an evaluation period of counting for the counters C and D, respectively. The evaluation period is followed by a transfer period defined by the next low-level half cycle of the EXT.CLK and EXT.CLK/ signals. During the evaluation period, the counters C and D produce their output counts. During the transfer period, the produced counts are accumulated by the corresponding adders 186.

Thus, when two or more INT.CLK or INT.CLK/ periods are detected in a high-level half cycle of the INT.CLK or INT.CLK/ signal, the counters C and D produce the corresponding counts represented by n-bit values. In the example illustrated in FIG. 7, each of the counters C and D detects two INT.CLK periods. Accordingly, their counts are equal to 1, and may be represented by 0001.

The adders 186 coupled to the counters C and D accumulate the n-bit counts produced during a predetermined number of EXT.CLK or EXT.CLK/ half cycles to generate the corresponding m-bit values. The current decoders 188 corresponding to the counters C and D produce the control current having values representing the m-bit values produced by the adders 186. These control current values are subtracted from the value of the base current to reduce the current supplied to the CCO. In response, the CCO frequency decreases to reduce the INT.CLK frequency so as to make the INT.CLK frequency closer to EXT.CLK frequency.

Figure 8:
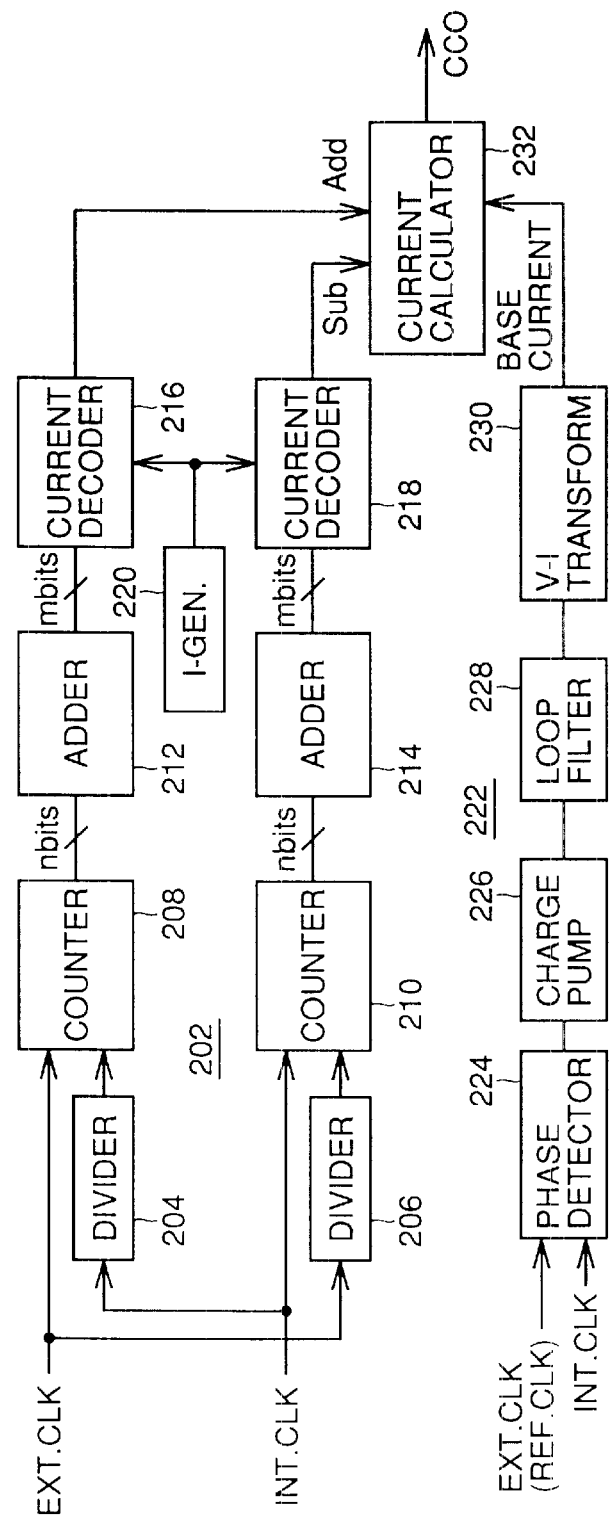
FIG. 8 illustrates another embodiment of the present invention employing frequency dividers and counters in the frequency adjustment circuit.

Reference is now made to FIG. 8 illustrating another example of the PLL of the present application that includes a frequency adjustment circuit 202 comprising frequency dividers 204 and 206 arranged at its input. The frequency divider 206 is supplied with an external reference clock EXT.CLK, whereas the frequency divider 204 is provided via a feedback loop with an internal clock INT.CLK produced at the output of the PLL. The dividers 204 and 206 are used for respectively dividing the INT.CLK frequency and the EXT.CLK frequency by a preset amount, for example by 2.

The frequency divider 204 is coupled to one input of a counter 208 having its another input supplied with the EXT.CLK signal. The frequency divider 206 is connected to one input of a counter 210, another input of which is provided with the INT.CLK signal. The counter 208 may count the number of the EXT.CLK periods in a half cycle of the signal produced by the divider 204. The counter 210 may count the number of the INT.CLK periods in a half cycle of the signal produced by the divider 206. The counters 208 and 210 produce n-bit counts representing the results of their counting operations.

Adders 212 and 214 are respectively coupled to the outputs of the counters 208 and 210 for accumulating the n-bit counts produced by the corresponding counter to generate an m-bit value. Current decoders 216 and 218 are respectively coupled to the outputs of the adders 212 and 214 for producing the control current that represents the output value of the corresponding adder.

A current generator 220 provides each of the current decoders 216 and 218 with a reference value of current. The current decoders 216 and 218 modify the reference current in accordance with the output values of the corresponding adders 212 and 214 to produce the control current.

A phase adjustment circuit 222 may comprise a phase detector 224 supplied with the EXT.CLK signal and the INT.CLK signal to produce a phase error signal representing phase and frequency differences between the EXT.CLK signal and the INT.CLK signal. The phase error signal is processed by a charge pump 226, a loop filter 228 and a voltage-to-current transformer 230 to produce a base current corresponding to the phase error signal. The elements of the phase adjustment circuit 222 operate similarly to the corresponding elements of the phase adjustment circuit 142 discussed above in connection with FIGS. 3 and 4.

A current calculator 232 is coupled to the outputs of the current decoders 216 and 218 and the voltage-to-current transformer 230 to add the value of the control current produced by the current decoder 216 to the value of the base current, or to subtract the value of the control current produced by the current decoder 218 from the value of the base current.

The current calculator 232 produces resulting current supplied to a control input of a CCO, such as a ring oscillator. When the EXT.CLK signal is first applied, the CCO frequency is determined by the base current. In response to the resulting current from the current calculator 232, the CCO frequency deviates so as to reduce phase and frequency difference between the EXT.CLK and INT.CLK signals. The CCO output signal may be processed by a level shifting and buffering circuit to produce the INT.CLK signals.

When the PLL is out of lock, the frequency adjustment circuit 202 operates in a mode of rough adjustment to bring the INT.CLK frequency at the CCO output closer to the frequency of the external clock EXT.CLK.

Figure 9:
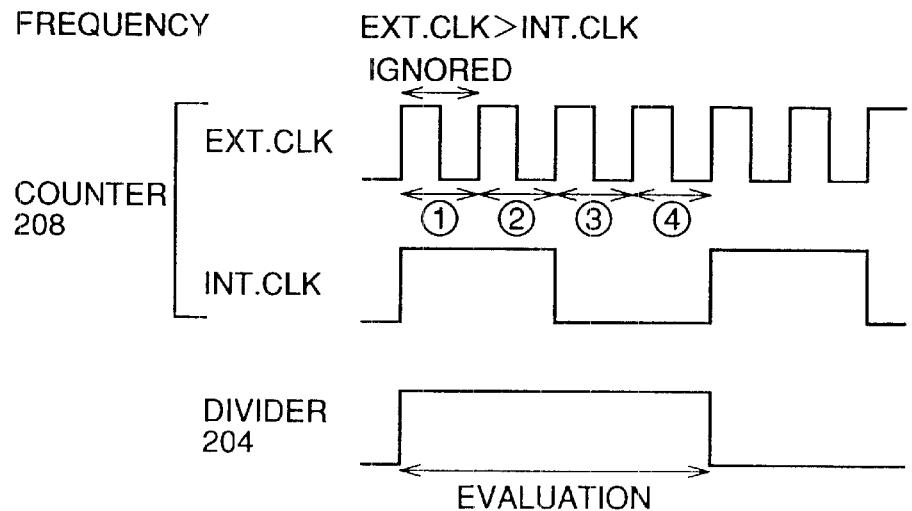
FIGS. 9 and 10 show waveforms illustrating operations of the frequency adjustment circuit in FIG. 8.

As illustrated in FIG. 9, when the EXT.CLK frequency is higher than the INT.CLK frequency, the counter 208 operates, whereas the counter 210 produces no counts.

In particular, the divider 204 divides the INT.CLK frequency, for example, by 2 and supplies the counter 208 with the signal having the frequency half as high as the INT.CLK frequency. Accordingly, a half cycle of the output signal of the divider 204 is twice as long as a half cycle of the INT.CLK signal. The counter 208 counts the number of EXT.CLK periods in a half cycle of the output signal produced by the divider 204. For example, the EXT.CLK periods may be counted in a high-level half cycle of the divided INT.CLK signal. The counter 208 may ignore the first period of the EXT.CLK signal in a high-level half cycle of the divided INT.CLK signal, and produce its count only in response to the EXT.CLK periods that follow the first period.

A high-level half cycle of the divided INT.CLK signal defines an evaluation period of counting. The evaluation period is followed by a transfer period defined by the next low-level half cycle of the divided INT.CLK signal. During the evaluation period, the counter 208 produces its output count. During the transfer period, the produced count is accumulated by the adder 212.

Thus, when two or more EXT.CLK periods are detected in a high-level half cycle of the divided INT.CLK signal, the counter 208 produces the corresponding count represented by an n-bit value. In the example, illustrated in FIG. 9, the counter 208 detects 4 periods of the EXT.CLK signal in a half cycle of the divided INT.CLK signal. Therefore, its count is equal to 3, and may be represented by 0011.

The adder 212 coupled to the counter 208 accumulates the n-bit counts produced during a predetermined number of the half cycles to generate the corresponding m-bit value. The current decoder 216 produces the control current representing the m-bit value produced by the adder 212. The control current value is added to the value of the base current to increase the current supplied to the CCO. In response, the CCO frequency increases to increase the INT.CLK frequency so as to make the INT.CLK frequency closer to EXT.CLK frequency.

Figure 10:
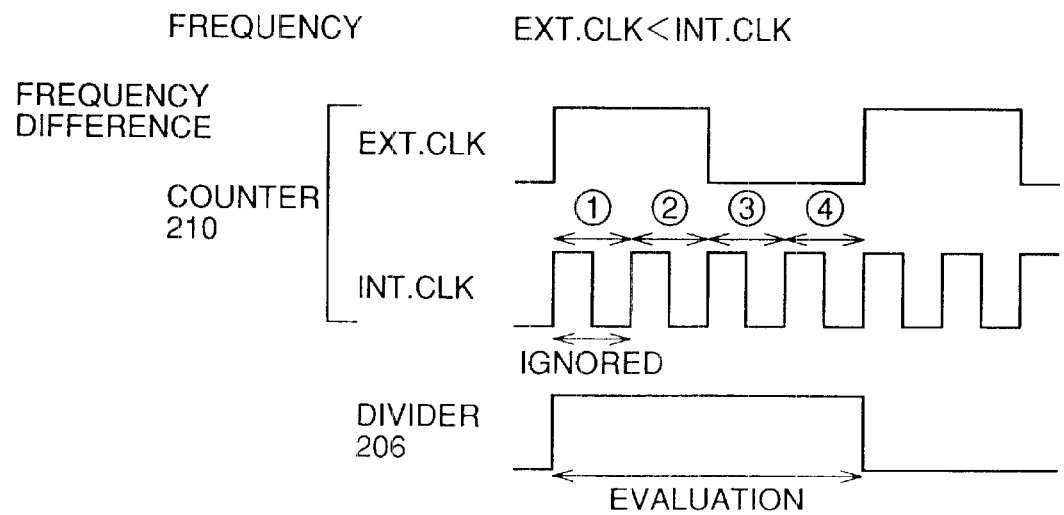

As illustrated in FIG. 10, when the INT.CLK frequency is higher than the EXT.CLK frequency, the counter 210 operates, whereas the counter 208 produces no counts.

In particular, the divider 206 divides the EXT.CLK frequency, for example, by 2 and supplies the counter 210 with the signal having the frequency half as high as the EXT.CLK frequency. Accordingly, a half cycle of the output signal of the divider 206 is twice as long as a half cycle of the EXT.CLK signal. The counter 210 counts the number of INT.CLK periods in a half cycle of the output signal produced by the divider 206. For example, the INT.CLK periods may be counted in a high-level half cycle of the divided EXT.CLK signal. The counter 210 may ignore the first period of the INT.CLK signal in a high-level half cycle of the divided EXT.CLK signal, and produce its count only in response to the INT.CLK periods that follow the first period.

A high-level half cycle of the divided EXT.CLK signal defines an evaluation period of counting. The evaluation period is followed by a transfer period defined by the next low-level half cycle of the divided EXT.CLK signal. During the evaluation period, the counter 210 produces its output count. During the transfer period, the produced count is accumulated by the adder 214.

Thus, when two or more INT.CLK periods are detected in a high-level half cycle of the divided EXT.CLK signal, the counter 210 produces the corresponding count represented by an n-bit value. In the example illustrated in FIG. 10, the counter 210 detects 4 periods of the INT.CLK signal in a half cycle of the divided EXT.CLK signal. Therefore, its count is equal to 3, and may be represented by 0011.

The adder 214 coupled to the counter 210 accumulates the n-bit counts produced during a predetermined number of the half cycles to generate the corresponding m-bit value. The current decoder 218 produces the control current representing the m-bit value produced by the adder 214. The control current value is subtracted from the value of the base current to reduce the current supplied to the CCO. In response, the CCO frequency decreases to reduce the INT.CLK frequency so as to make the INT.CLK frequency closer to EXT.CLK frequency.

The dividers 204 and 206 allow the evaluation period to be increased. As a result, the accuracy of the frequency difference detection is improved. As the divisor for the dividers 204 and 206 may be variable, the operating parameters of the PLL may be adjustable.

Figure 11:
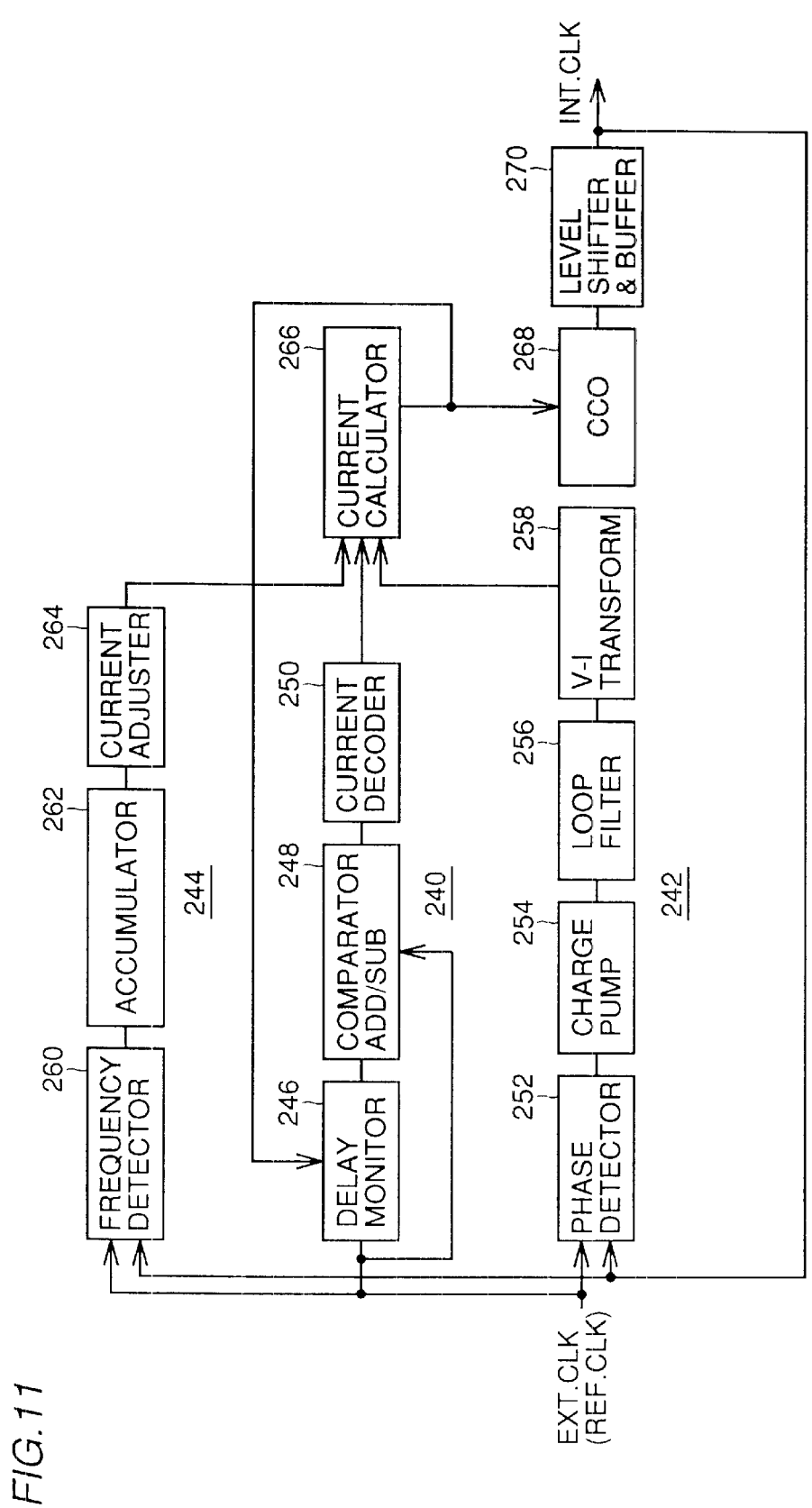
FIG. 11 is a simplified block diagram illustrating a further embodiment of the present invention employing a fine adjustment circuit, in addition to the phase and frequency adjustment circuits.

Reference is now made to FIG. 11 schematically illustrating a further embodiment of the PLL of the present invention having a fine adjustment circuit 240, in addition to a phase adjustment circuit 242 and a frequency adjustment circuit 244, to carry out fine tuning of the CCO frequency when the internal clock frequency is close to the external clock frequency. The fine adjustment circuit 240 includes a delay monitor 246 supplied with an external reference clock EXT.CLK. As described in more detail later, the delay monitor 246 may comprise a delay line for delaying the EXT.CLK signal by delay time amounts slightly less and slightly more than a period of the CCO output signal. A signal supplied from the control input to the CCO may be used to adjust the delay time of the delay line. A comparator 248 is coupled to the delay monitor 246 for comparing the input to the delay monitor 246 with its outputs. The comparator 248 produces a value that represents fine tuning current to be added or subtracted from the control current supplied to the CCO input, in order to provide the fine tuning of the CCO. A current decoder 250 produces the fine tuning current corresponding to the value determined by the comparator 248. This current is added to or subtracted from the control current supplied to the CCO input depending on whether the EXT.CLK frequency is higher or lower than the CCO output frequency.

The phase adjustment circuit 242 comprises a phase detector 252, a charge pump 254, a loop filter 256, and a voltage-to-current transformer 258 that operate similarly to the corresponding elements of the phase adjustment circuit 142 described in connection with FIG. 4. The frequency adjustment circuit 244 comprises a frequency detector 260, an accumulator 262 and a current adjuster 264 that operate similarly to the corresponding elements of the frequency adjustment circuit 148 described in connection with FIG. 4.

A current calculator 266 is coupled to outputs of the current decoder 250, the voltage-to-current transformer 258 and the current adjuster 264 for calculating the value of control current to be supplied to a CCO 268. The output signal of the CCO 268 may be processed by the level shifting and buffering circuit 270 to produce an internal clock signal INT.CLK at the CCO output frequency.

When the external reference clock EXT.CLK is first applied, the frequency of the CCO 268 may be determined by base current produced by the voltage-to-current transformer 258 in the phase adjustment circuit 242. If the PLL is out of lock, the frequency adjustment circuit 244 operates in a mode of rough frequency adjustment to bring the CCO frequency closer to the frequency of the external clock EXT.CLK.

When the CCO frequency becomes closer to the EXT.CLK frequency, the PLL 140 may go to a fine frequency adjustment mode to perform accurate phase and frequency adjustment. In this mode, the fine adjustment circuit 240 provides the fine tuning of the CCO frequency to further reduce the frequency difference between the INT.CLK signal and the EXT.CLK signal.

Figure 12:
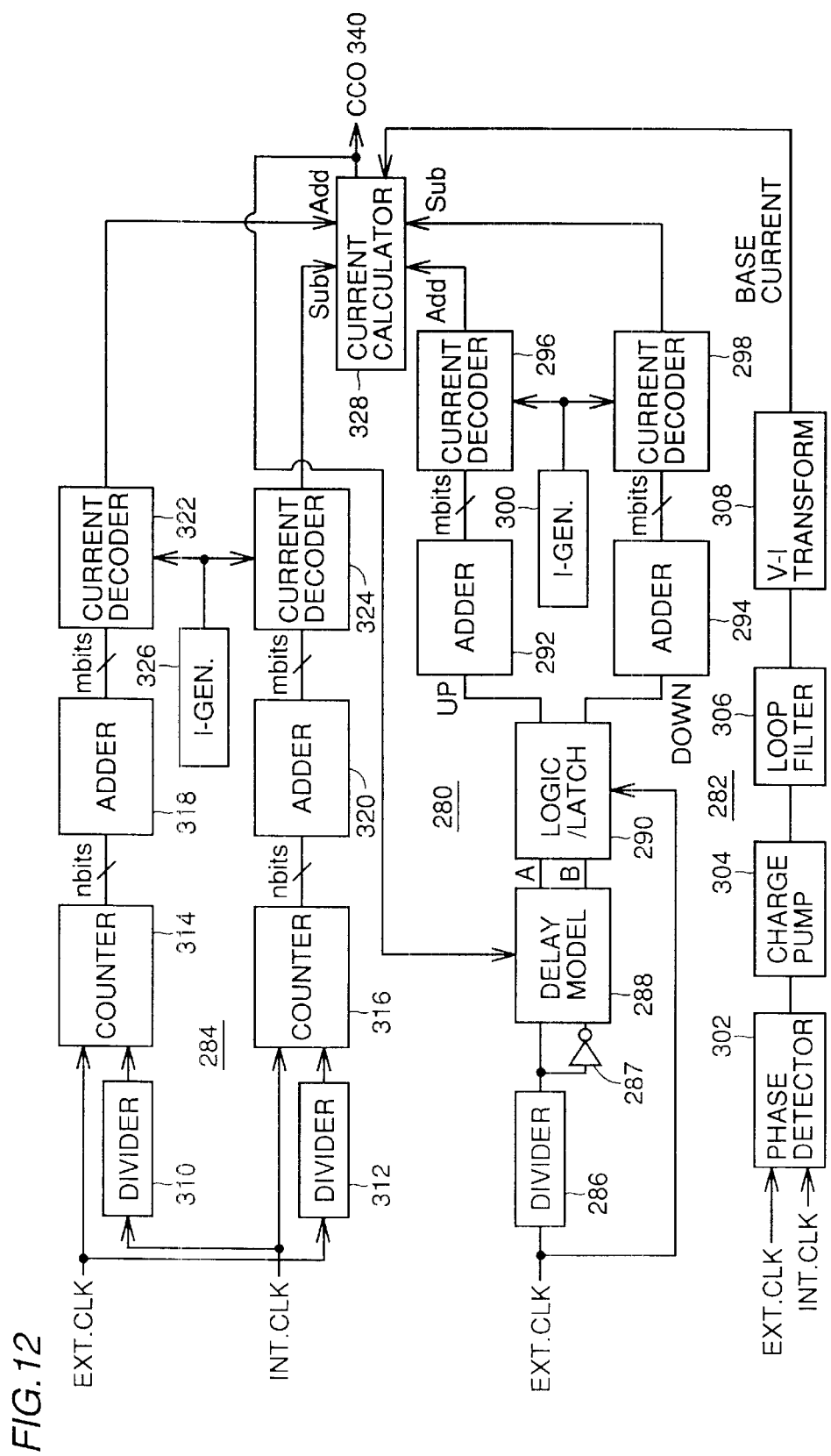
FIG. 12 is a block diagram presenting the fine adjustment circuit and the frequency adjustment circuit in more detail.

Reference is now made to FIG. 12 that shows an exemplary embodiment of the PLL having a fine adjustment circuit 280, a phase adjustment circuit 282 and a frequency adjustment circuit 284 to provide the fine tuning of the CCO frequency, in addition to frequency and phase adjustments. The fine adjustment circuit 280 may comprise a frequency divider 286 supplied with the external reference clock EXT.CLK. For example, the divider 286 may divide the EXT.CLK frequency by 2 to produce a divided external clock signal DIV.EXT.CLK. A delay model 288 is coupled to the output of the divider 286 to delay the DIV.EXT.CLK signal. An inverter 287 may be provided to supply the inverted value of the DIV.EXT.CLK signal to one of the delay model inputs. As will be discussed in more detail later, the delay model 288 has two outputs A and B. The signal supplied from the output A may be delayed with respect to the DIV.EXT.CLK signal by a delay time slightly smaller than a period of a CCO 340 provided to generate the internal clock signal INT.CLK. The signal supplied from the output B may be delayed with respect to the DIV.EXT.CLK signal by a delay time slightly larger than the period of the CCO.

A logic/latch circuit 290 is coupled to the outputs A and B of the delay model 288 to compare its input signal with the signals supplied from the outputs A and B. The logic/latch circuit 290 produces an UP signal when rising edges of the signals supplied from the outputs A and B are delayed with respect to the rising edge of the DIV.EXT.CLK signal by a time period larger than the period of the EXT.CLK signal, i.e. when the EXT.CLK frequency is higher than the INT.CLK frequency. The logic/latch circuit 290 generates a DOWN signal when rising edges of the the signals supplied from the outputs A and B are delayed with respect to the rising edge of the DIV.EXT.CLK signal by a time period smaller than a period of the EXT.CLK signal, i.e. when the EXT.CLK frequency is lower than the INT.CLK frequency.

The UP and DOWN signals are respectively supplied to adders 292 and 294 which accumulate results of the comparison carried out by the logic/latch circuit 290, and produce the corresponding m-bit values. Current decoders 296 and 298 supplied by a current generator 300 are respectively connected to the outputs of the adders 292 and 294 to produce control current representing the m-bit values produced by the adders 292 and 294. The current generator 300 provides each of the current decoders 296 and 298 with a reference value of current. The current decoders 296 and 298 modify the reference current in accordance with the output values of the corresponding adders 292 and 294 to produce the control current.

The phase adjustment circuit 282 may comprise a phase detector 302 supplied with the EXT.CLK signal and the INT.CLK signal to produce a phase error signal representing phase and frequency differences between the EXT.CLK signal and the INT.CLK signal. The phase error signal is supplied to a charge pump 304, a loop filter 306 and a voltage-to-current transformer 308 to produce a base current corresponding to the phase error signal.

The frequency adjustment circuit 284 may comprise dividers 310 and 312 arranged at its input. The divider 312 is supplied with the EXT.CLK signal, whereas the divider 314 is provided via a feedback loop with the INT.CLK signal produced by the CCO at the output of the PLL. The dividers 310 and 312 are respectively connected to counters 314 and 316 further supplied with the EXT.CLK and INT.CLK signals. The counters 314 and 316 respectively count the number of the EXT.CLK and INT.CLK periods in a half cycle of the signals produced by the dividers 310 and 312. Adders 318 and 320 are respectively coupled to the counters 314 and 316 for accumulating the n-bit counts produced by the corresponding counter to generate an m-bit value. Current decoders 322 and 324 supplied with a current generator 326 are respectively coupled to the outputs of the adders 318 and 320 for producing the control current that represents the m-bit value of the corresponding adders.

The elements of the phase adjustment circuit 282 and the frequency adjustment circuit 284 may operate in a manner similar to the operation of the corresponding elements of the phase adjustment circuit 222 and the frequency adjustment circuit 202 illustrated in FIG. 8.

A current calculator 328 is coupled to the outputs of the current decoders 296 and 298 of the fine adjustment circuit 280, the current decoders 322 and 324 of the frequency adjustment circuit 284, and the voltage-to-current transformer 308 of the phase adjustment circuit 282. When the EXT.CLK signal is first applied, the output current of the current calculator 328 is determined by base current supplied from the voltage-to-current transformer 308. For rough frequency adjustment, the current calculator 328 adds the value of the control current produced by the current decoder 322 to the value of the base current, or subtracts the values of the control current produced by the current decoders 324 from the value of the base current. For fine frequency adjustment, the current calculator 328 adds the value of the control current produced by the current decoder 296 to the value of the base current, or subtracts the values of the control current produced by the current decoders 298 from the value of the base current.

Figure 13:
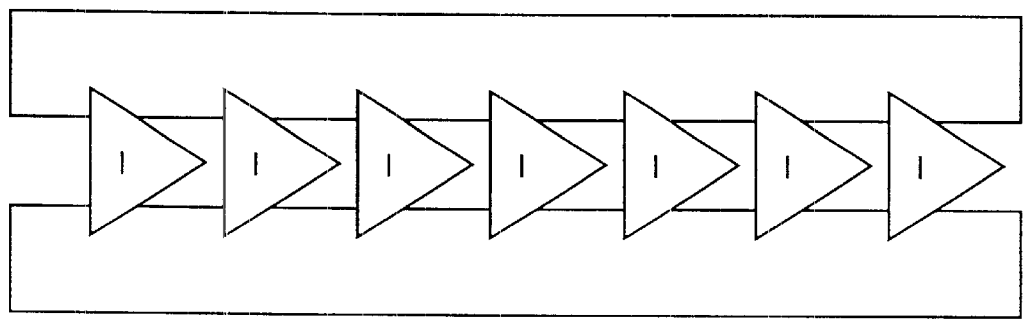
FIG. 13 illustrates an example of a CCO.

The output of the current calculator 328 is connected to the control input of the CCO to control the phase and frequency of the INT.CLK signal produced by the CCO. Referring to FIG. 13, the CCO 340 may be implemented by a ring oscillator composed of k inverter stages I, where k is an odd number. For example, the ring oscillator 340 may have seven inverter stages I connected serially with each other. The inverting and non-inverting outputs of the last inverter stage I are respectively coupled to the inverting and non-inverting inputs of the first inverter stage I.

Figure 14:
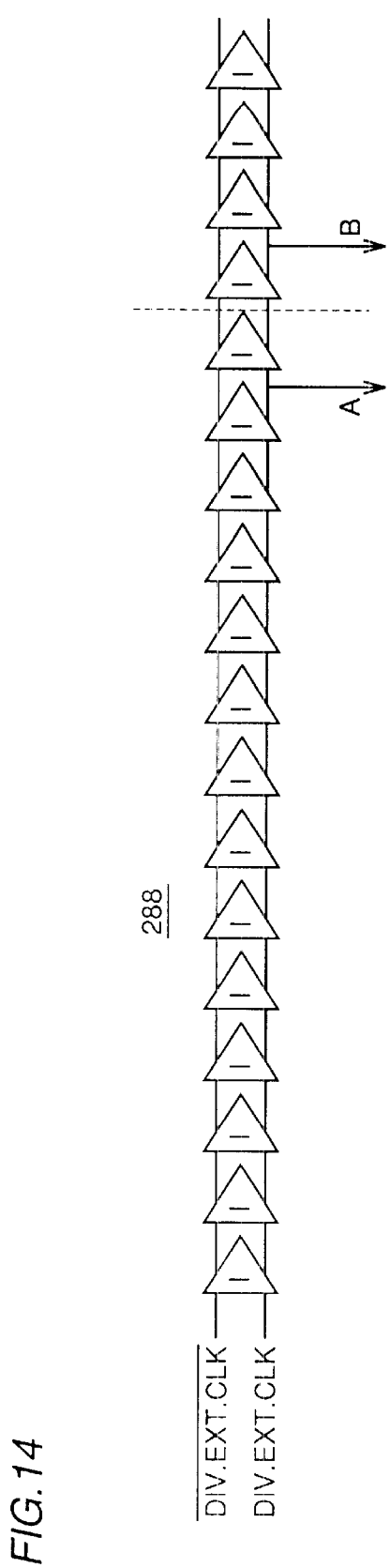
FIG. 14 shows a delay model employed in the fine adjustment circuit.

Referring to FIG. 14, the delay model 288 may be composed of more than 2k serially connected inverter stages I to be capable of delaying a DIV.EXT.CLK signal produced at the output of the divider 286 by a delay time larger than the period of the ring oscillator 340. For example, the output A may be provided at the output of inverter stage 2k−1, and the output B may be arranged at the output of inverter stage 2k+1. Thus, when the ring oscillator 340 contains seven inverter stages I, the output A may be provided at the output of the thirteen inverter stage I, whereas the output B may be arranged at the output of the fifteenth inverter stage I. The non-inverting input of the first inverter stage I is fed with the DIV.EXT.CLK signal supplied from the divider 286. The inverting input of the first inverter stage I receives the inverted value of the DIV.EXT.CLK signal supplied from the inverter 287.

Figure 15:
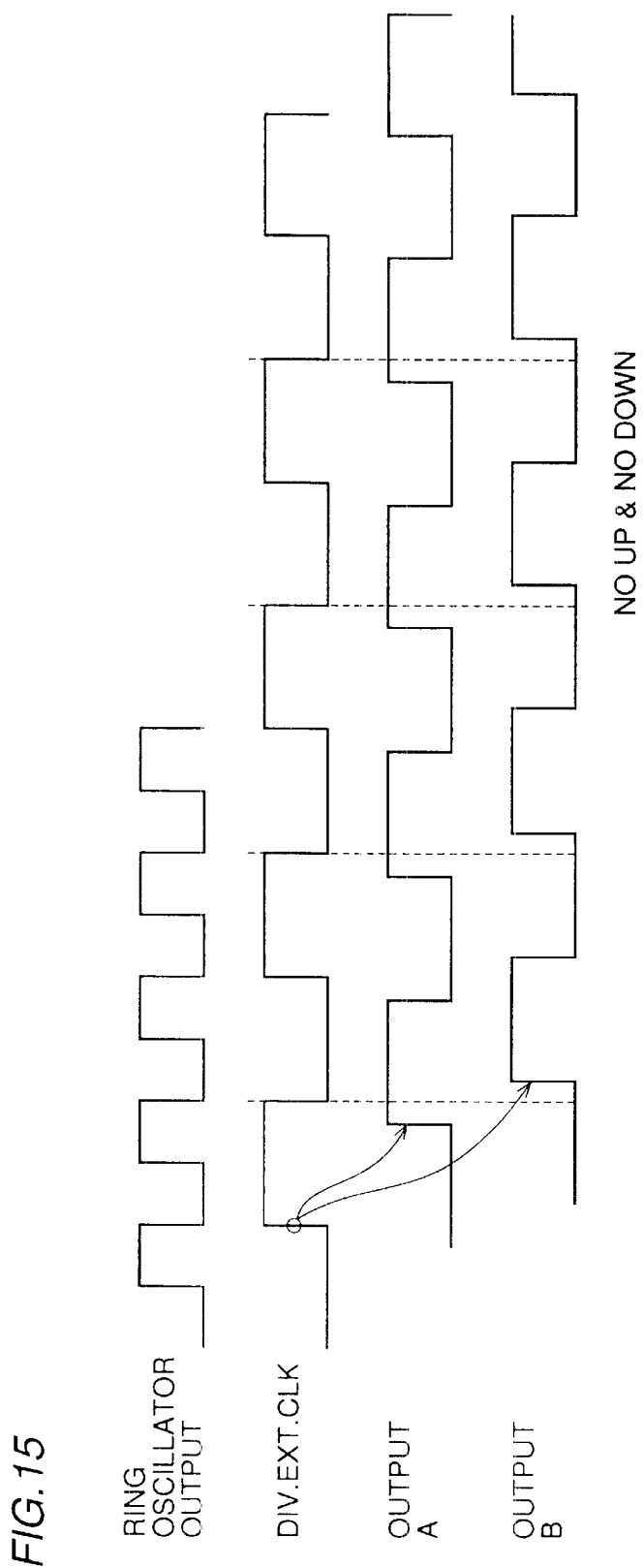
FIGS. 15–17 are waveforms illustrating operations of the fine adjustment circuit in FIG. 12.

As illustrated in FIG. 15, when the INT.CLK frequency at the output of the ring oscillator 340 is equal to the EXT.CLK frequency, the rising edge of the signal supplied from the output A of the delay model 288 is delayed with respect to the rising edge of the DIV.EXT.CLK by a delay time slightly smaller than the period of the INT.CLK signal at the output of the ring oscillator 340. The rising edge of the signal supplied from the output B of the delay model 288 is delayed with respect to the rising edge of the DIV.EXT.CLK by a delay time slightly larger than the period of the INT.CLK signal. As a result, no UP signal or DOWN signal is generated at the output of the logic/latch circuit 290. For example, the logic/latch circuit 290 may detect logic levels of the output A and output B signals at the instant in which the DIV.EXT.CLK signal makes the transition from its high level to its low level. If the logic levels of the output A and output B signals are different, the logic/latch circuit 290 produces no UP and DOWN signals.

Figure 16:
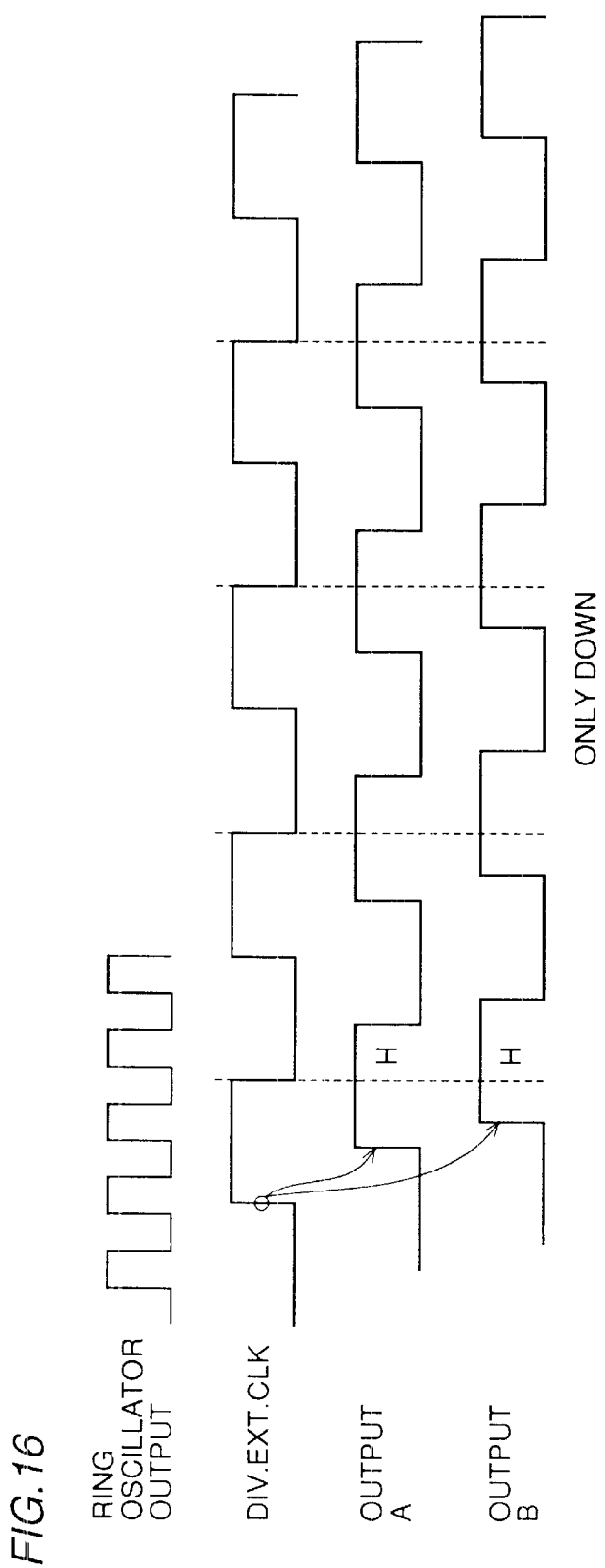

Referring to FIG. 16, when the INT.CLK frequency at the output of the ring oscillator 340 is higher than the INT.CLK frequency, the rising edges of the output A and output B signals are delayed with respect to the rising edge DIV.EXT.CLK by a delay time smaller than the period of the EXT.CLK signal. The logic/latch circuit 290 may detect that both the output A and output B signals are at a high level H at the instant in which the DIV.EXT.CLK signal goes low. As a result, the DOWN signal may be supplied to the adder 294.

The DOWN signal may be accumulated in the adder 294 for a predetermined time period to produce an m-bit DOWN value supplied to the current decoder 298. In response, the current decoder 298 produces a value of control current corresponding to the DOWN value. The current calculator 328 subtracts the produced control current from the base current supplied from the phase adjustment circuit 282. Accordingly, the resulting current supplied to the input of the ring oscillator 340 decreases. As a result, the INT.CLK frequency at the output of the ring oscillator 340 reduces so as to be closer to the EXT.CLK frequency. The CCO output signal may be processed by a level shifting and buffering circuit to produce the INT.CLK signal. The fine adjustment procedure continues until the logic/latch circuit 290 detects that the output A signal is at a high level and the output B signal is at a low level at the instant in which the DIV.EXT.CLK signal makes its transition from a high level to a low level.

Figure 17:
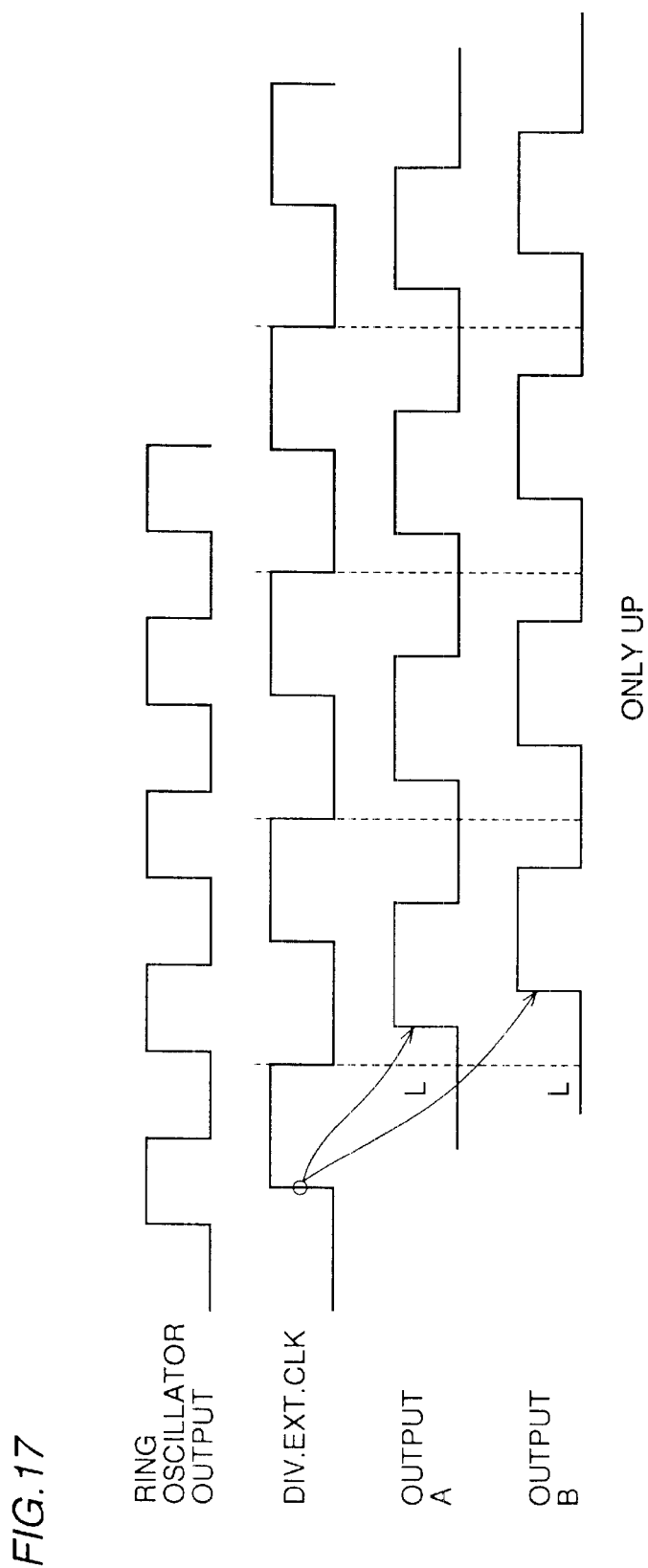

As illustrated in FIG. 17, when the INT.CLK frequency at the output of the ring oscillator 340 is lower than the INT.CLK frequency, the rising edges of the output A and output B signals are delayed with respect to the rising edge of the DIV.EXT.CLK by a delay time larger than the period of the EXT.CLK signal. The logic/latch circuit 290 may detect that both the output A and output B signals are at a low level L at the instant in which the DIV.EXT.CLK signal goes low. When logic levels at the outputs A and B are at a low level, the logic/latch circuit 290 may produce an UP signal supplied to the adder 292.

The UP signal is accumulated in the adder 292 for a predetermined time period to produce an m-bit UP value supplied to the current decoder 296. In response, the current decoder 298 produces a value of control current corresponding to the UP value. The current calculator 328 adds the produced control current to the base current supplied from the phase adjustment circuit 282. Accordingly, the resulting current supplied to the input of the ring oscillator 340 increases. As a result, the INT.CLK frequency at the output of the ring oscillator 340 increases so as to be closer to the EXT.CLK frequency. The CCO output signal may be processed by a level shifting and buffering circuit to produce the INT.CLK signal. The fine frequency adjustment continues until the logic/latch circuit 290 detects that the output A signal is at a high level and the output B signal is at a low level at the instant in which the DIV.EXT.CLK signal makes its transition from a high level to a low level.

As the time interval between the rising edges of the output A and output B signals is very small, the fine adjustment circuit 280 provides very accurate phase and frequency adjustment of the INT.CLK signal with respect to the EXT.CLK signal.

The resulting current from the output of the current calculator 328 may be fed back to the delay model 288 to adjust its delay time in accordance with the value of the current at the input of the CCO 340, i.e. in accordance with the CCO output frequency variations. For example, when the current at the CCO input increases to increase the INT.CLK frequency at the output of the ring oscillator 340, the period of the CCO output reduces. Accordingly, the delay time of the delay model 288 is reduced to match the reduction of the CCO period.

By contrast, when the current at the CCO input decreases to reduce the INT.CLK frequency at the CCO output, the CCO period increases. To match this increase, the delay model 288 is adjusted to increase its delay time.

When the PLL is out of lock, it operates in a rough frequency adjustment mode, in which the frequency adjustment circuit 284 dominates over the phase adjustment circuit 282 and the fine adjustment circuit 280. When the frequency adjustment circuit 284 brings the INT.CLK frequency closer to the frequency of the external clock EXT.CLK, the PLL carries out a fine adjustment mode, in which the fine adjustment circuit 280 interacts with the phase adjustment circuit 282 to more accurately adjust the INT.CLK frequency with respect to the EXT.CLK frequency.

Figure 18:
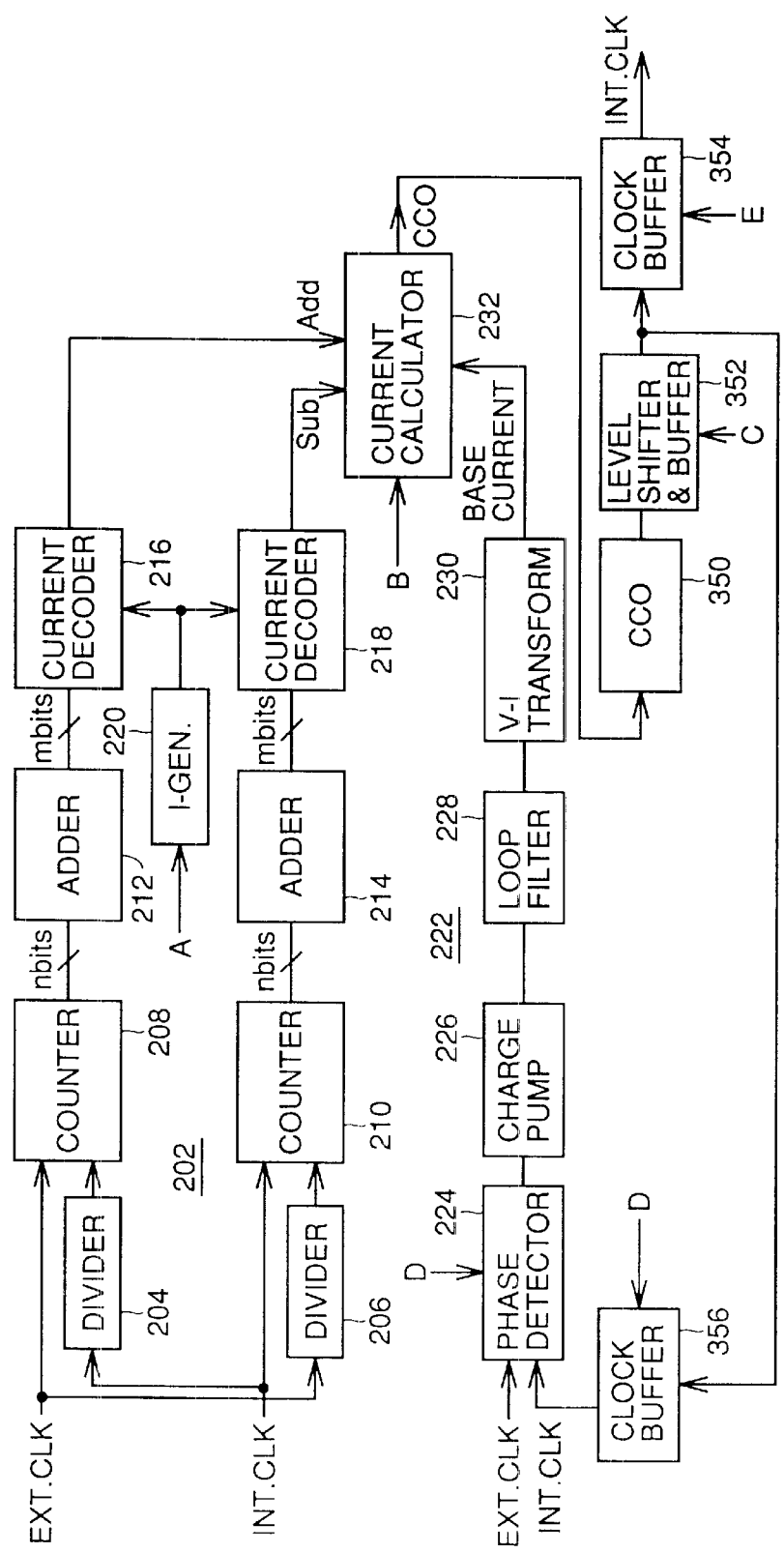
FIG. 18 illustrates supplying command clocks to control the PLL operations.

As discussed above in connection with FIG. 2 that illustrates an exemplary system in which the PLL of the present invention may be employed, the command decoder 126 decodes the external commands to generate command clocks A–E for controlling various elements of the PLL in the internal synchronous signal generator 104 to produce the INT.CLK signal. FIG. 18 illustrates supplying the command clocks A–E to elements of the PLL having the phase adjustment circuit 222 and the frequency adjustment circuit 202 shown in FIG. 8. In particular, clock A may be supplied to the current generator 220 in the frequency adjustment circuit 202. Clock B may be supplied to the current calculator 232 that provides a CCO 350 with a resulting control current. Clock C may be supplied to a level shifting and buffering circuit 352 coupled to the output of the CCO 350. Clock D may be sent to the phase detector 224 in the phase adjustment circuit 222, and to a clock buffer 356 that may be used for buffering the internal clock signal INT.CLK before supplying it to the phase detector 224. Finally, clock E may be supplied to a dock buffer 354 that may be connected to the output of the level shifting and buffering circuit 352 to provide buffering of its output signal. The output clock signal produced by the dock buffer 354 is supplied to circuitry external with respect to the internal synchronous signal generator 104.

When the PLL is in a power off mode, the current generator 220 is disabled by clock A. As a result, no current is supplied by this generator. The current generator 220 is activated when power is supplied to the PLL. After a stand-by time period, clock B is supplied to enable the current calculator 232 to provide the CCO 350 with control current. Clock C enables the level shifting and buffering circuit 352 to output the signal produced by the CCO 350. Thereafter, clock D is supplied to initiate a locking procedure for bringing the PLL into lock. This clock enables the clock buffer 356 to supply the phase detector with the INT.CLK signal. Also, clock D enables the clock buffer 102 to provide the PLL with the EXT.CLK signal. Clock E supplied after the PLL is brought into lock, enables the clock buffer 354 to deliver the produced internal clock INT.CLK to the external circuitry.

After the PLL is brought into lock, a self-refreshing mode may be carried out when the external clock EXT.CLK is not provided. A free-running clock may be supplied from an additional ring oscillator to control the PLL operations in this mode. The free-running clock supplied instead of the EXT.CLK signal allows the PLL to quickly return to a locked condition.

Figure 19:
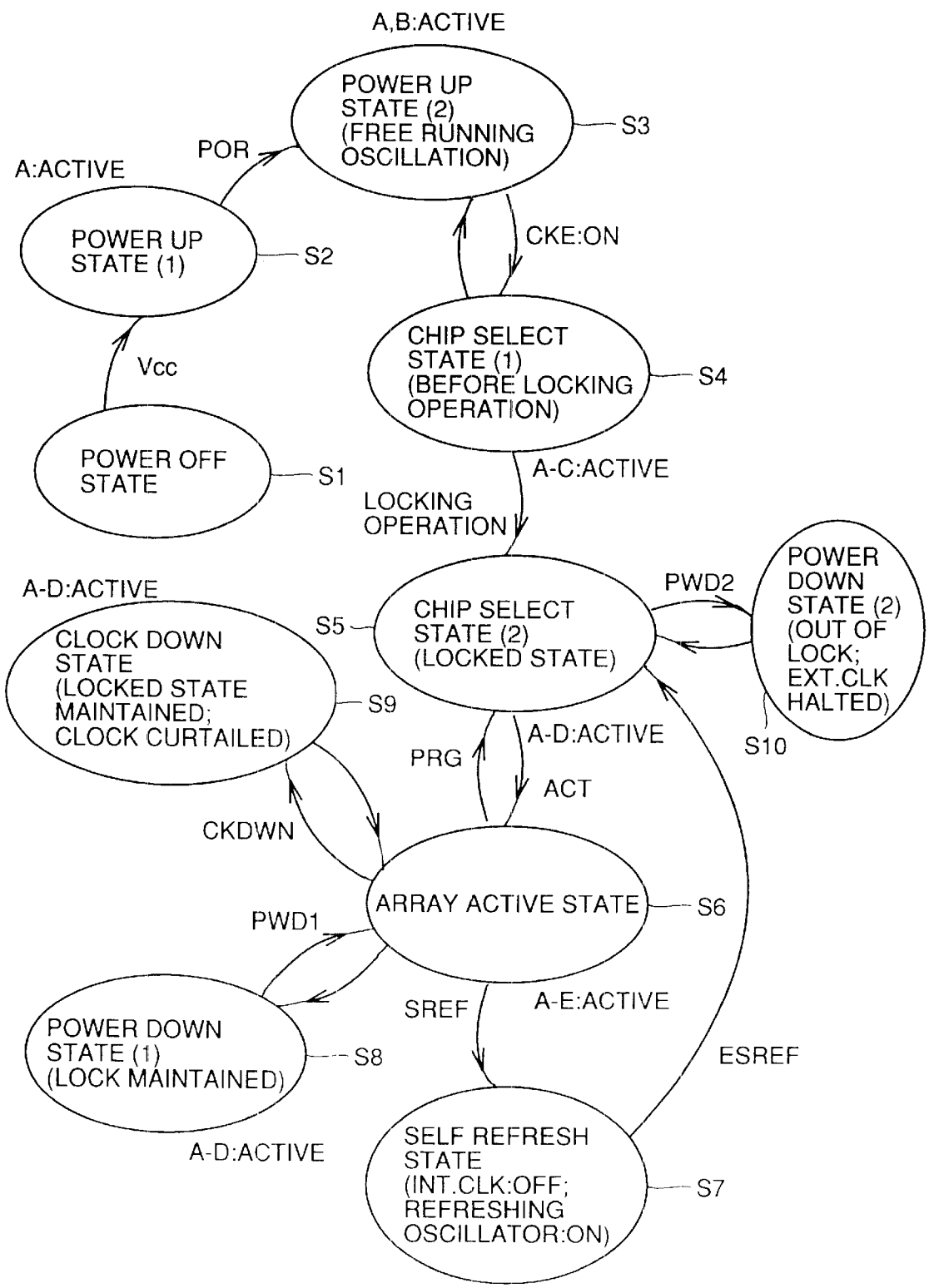
FIG. 19 illustrates an example of the state transition of the PLL shown in FIG. 18.

Hereinafter, the state transition of the PLL in FIG. 18 (the internal synchronous signal generator 104 shown in FIG. 2) will be described with reference to FIG. 19. Here, FIG. 19 illustrates an example of the state transition of the PLL when it is used as the internal synchronous signal generator 104 of the clock synchronous type semiconductor memory device shown in FIG. 2.

When PLL is in a power off state (state S1) with no power being supplied, command clocks A–E output from command decoder 126 shown in FIG. 2 are all in an inactive state.

When power is supplied and the voltage level of power supply voltage Vcc increases, PLL initially enters a power up state (1) (state S2). In this state, command clock A is driven to an active state, while all the other command clocks B–E are held at an inactive state. As a result, only the current generator 220 in FIG. 18 is enabled to generate a current. This power up state (1) is a state in which power is simply supplied and thus the voltage level of power supply voltage Vcc is increased, in which the operations of the internal circuits are halted by an internally generated power on reset signal POR.

When power supply voltage Vcc becomes stable, power on reset signal POR is activated to allow PLL to shift from the state S2 to a power up state (2) (state S3). In this power up state (2), command clocks A, B are rendered active, while the other command clocks C–E remain inactive. As a result, current calculator 232 in FIG. 18 is enabled to provide a control current to CCO 350. As command clock D is in an inactive state, PLL is in a free-running, oscillating state, performing no locking operation.

When clock enable signal CKE is set to an active state (an on state), PLL shifts from the state S3 to a chip select state (1) (state S4) allowing accessing to this semiconductor memory device. With this dock enable signal CKE in an active state, the semiconductor memory device in FIG. 2 enters a state allowing acceptance of an externally supplied signal. In this chip select state (1), command clocks A–C are in an active state, while command clocks B, E remain inactive. Therefore, PLL does not perform the locking operation yet in this state because it has just been driven to the chip select state, and a stable clock signal synchronized with the externally supplied clock signal EXT.CLK is not generated yet.

In a predetermined time period after entry into the chip select state (1), PLL transits from the state S4 to a chip select state (2)(state S5), in which command docks A–D are driven to an active state. Command dock E remains inactive, thereby keeping dock buffer 354 in FIG. 18 in a disabled state. As command dock B is activated, PLL in FIG. 18 initiates the locking operation according to externally supplied dock signal EXT.CLK and internal dock signal supplied from level shifting and buffering circuit 352, to drive the internal dock signal INT.CLK into a locked state to the external dock signal EXT.CLK.

In the chip select state (2) (state S5), a row select operation is performed in the semiconductor memory device when an active command ACT is provided. With this active command ACT provided, the row select operation should be performed within the semiconductor memory device, so that command dock E is activated to provide internal clock signal INT.CLK supplied from dock buffer 354 in FIG. 18 to each of the internal circuits. In this array active state (state S6), a word line is kept at a selected state. When the precharge command PRG is provided, PLL returns from the array active state (state S6) back to the chip select state (2).

When a self refresh command SREF is provided in the array active state (state S6), the semiconductor memory device enters a self refresh state (state S7), in which a memory cell data is refreshed with a refresh address generated using an internal refresh address counter. The self refresh operation is performed using a refreshing oscillator and a refresh counter for counting the number of docks of the refreshing oscillator which are internally provided for refreshing. In this self refresh state (state S7), the refreshing oscillator is set to an active state (an on state) to allow a control signal for instructing the row select operation to be generated at a predetermined interval (by internal control signal generator 106 shown in FIG. 2). Since the internal dock signal from PLL shown in FIG. 18 is unnecessary for the internal circuit operations in this state, command docks A–E are all driven to an inactive state. In this state, different from the power off state, command docks A–E are only driven inactive, while the m-bit binary value to be applied to current decoders 216, 218 in FIG. 18 is maintained. Keeping all the command docks A–E inactive in this self refresh state (state S7) allows reduction in current consumption.

When the self refresh state (state S7) is complete, a self refresh end command ESREF is provided. Since PLL is required to perform the locking operation to reset the self refresh state, command clocks A–D are driven to an active state. Meanwhile, command dock E remains inactive. In the shift from the self refresh state (state S7) to the chip select state (2) (state S5), the array temporarily enters a precharge state. As the (binary) current value for generating an internal clock signal in PLL is maintained, the use of this value (representing a phase and frequency in its locked state) substantially reduces the recovery time required for the PLL to reinstate a locked state.

PLL goes from the array active state to a power down mode for reducing current consumption, for which power down mode two states are possible: a power down state (1) (state S8); and a dock down state (state S9). In the power down state (1) (state S8), the external dock signal EXT.CLK is continuously supplied with generation of the internal dock signal INT.CLK stopped within the semiconductor memory device, thereby keeping the device in this power down mode. In the dock down state (state S9), the frequency of the externally supplied dock signal EXT.CLK is divided by a factor of N to decrease the current consumption in external devices as well as in the dock buffer. Since external dock signal EXT.CLK is continuously provided in the power down state (1) (state S8), only the command dock E is made inactive, while the other command docks A–D are held at an active state to keep PLL in the locked state. In this manner, when no access is attempted to the semiconductor memory device or no operation is performed in a system using this device for a relatively short time period, PLL is temporarily driven to the power down state (1) for reducing current consumption, and then driven back to the previous array active state (state S6). Here, since the external dock signal EXT.CLK and the internal dock signal INT.CLK are both in a locked state, PLL can return to the array active state (state S6) quickly to perform the next operation.

In the dock down state (state S9), a clock signal divided in frequency by a factor of N is externally supplied. Similarly in this state, only command clock E is made inactive, while the other command docks A–D remain active. Although not shown in FIG. 18, an N frequency-divider is inserted between level shifting and buffering circuit 352 and clock buffer 356 or between clock buffer 356 and phase detector 224 in the dock down state (state S10). The dock output from this internal frequency-divider and the externally supplied, frequency-divided dock signal are compared to allow the locking operation to be continued. Using this frequency-divided dock signal, the operation frequencies of the comparator and the buffer are reduced by a factor of N, and thus current consumption is further reduced. PLL is shifted to this clock down state S9 by a clock down command CKDWN when no access is made to the semiconductor memory device for a relatively long time. Meanwhile, the shift to the power down state (1) (state S8) is effected by a power down command PWD1.

The semiconductor memory device in the chip select state (2) can make a transition to a power down state. This shift from the chip select state (2) (state S5) to the power down state (2) (state S10) occurs when a power down command PWD2 is provided. The power down state (2) corresponds to a state in which the semiconductor memory device is not in use for a relatively long time (e.g. in which a portable terminal only needs to retain data). Generation of external dock signal EXT.CLK is terminated, and in response, the lock is released. As a result, command clocks A–E are all driven to an inactive state, whereby almost no current is consumed in this semiconductor memory device.

Except for the power up state, driving of respective command docks A–E to active/inactive states according to the PLL states are implemented by the command decoder 126 shown in FIG. 2 in response to an externally supplied command. Upon power-up, command decoder 126 performs sequential activation of command docks A, B according to the power on reset signal POR supplied from a power on reset circuit, not shown. Here, any structure may be used as long as it is capable of driving command dock A to an active state, then activating the power on reset signal POR and then driving command dock B to an active state upon power-up.

In the PLL shown in FIG. 18, a frequency-divider is used in the dock down state to perform the locking operations between the frequency-divided internal dock signal and the externally supplied divided clock signal. This is implemented by connecting the frequency-divider between level shifting and buffering circuit 352 and clock buffer 356 or between phase detector 224 and dock buffer 356 by a selector circuit and the frequency-divider is activated, when the clock down command CKDWN is provided to designate the clock down state (state S9). Here, the structure to be used has only to select either the frequency-divided internal dock signal of this frequency-divider or the internal dock signal from level shifting and buffering circuit 352, depending on whether PLL is in the clock down state (state S9) or not.

It is to be understood that, although the description was made about PLL (see FIG. 18) in the above, the state transition as shown in FIG. 19 can be applied to another synchronous circuit employing, for example, a Delayed Locked Loop (DLL).

There accordingly has been described a PLL that employs separate phase a frequency adjustment circuits to adjust the frequency of a produced internal dock independently from adjusting its phase. The phase adjustment circuit determines a phase error between the internal clock and an external dock, and averages the phase error over a predetermined time period to produce the corresponding control current. The frequency adjustment circuit detects the difference between the frequency of the internal dock and the frequency of the external clock to determine a frequency error. An accumulator accumulates the frequency error during the predetermined time period to produce the corresponding control current. Based on values of the control currents produced by the phase and frequency adjustment circuits, a current calculator calculates a resulting value of the control current to be applied to a CCO to modify its frequency so as reduce the frequency and phase differences.

In this disclosure, there are shown and described only the preferred embodiments of the invention, but it is to be understood that the invention is capable of changes and modifications within the scope of the inventive concept as expressed herein.

What is claimed is:

1. A semiconductor device operating in synchronization with an external clock signal, comprising:

clock synchronization circuitry receiving said external clock signal and generating an internal clock signal synchronous with said external clock signal, said clock synchronization circuitry including an internal circuit kept in an active state for performing a predetermined operation when power is up, said internal circuit performing, when activated, said predetermined operation after a power supply voltage is stabilized after the power up; and internal circuitry operating in synchronization with said internal clock signal, for performing a predetermined operation.

2. The semiconductor device according to claim 1, wherein said internal circuit comprises a reference current generating circuit for generating a reference current.

3. The semiconductor device according to claim 2, wherein said internal clock signal is kept in an inactive state when the power is up.

4. The semiconductor device according to claim 1, wherein the internal circuit is kept in an active state when power is up, for generating a reference signal used for generating said internal clock signal, and said clock synchronization circuitry includes a clock generating circuit for generating said internal clock signal in synchronization with said external clock signal, said clock generating circuit kept in a free running state to operate independent of said external clock signal when the power is up.

5. The semiconductor device according to claim 4, wherein said clock generating circuit keeps said internal clock signal in an inactive state when kept in said free running state.

6. The semiconductor device according to claim 1, wherein said clock synchronization circuit comprises a clock generator responsive to a first operation activating signal, for performing a synchronization operation on said external clock signal to generate a first clock signal synchronous with said external clock signal.

7. The semiconductor device according to claim 6, wherein said clock synchronization circuit further comprises a clock output circuit receiving said first clock signal to generate said internal clock signal, said clock output circuit holding said internal clock signal in an inactive state when said first operation activation signal is applied.

8. The semiconductor device according to claim 6, wherein said clock synchronization circuit further comprises a clock output circuit for receiving said first clock signal and activated in response to a second operation activation signal for generating said internal clock signal in accordance with said first clock signal received from said clock generator.

9. A semiconductor device operating synchronously with an external clock signal, comprising:

clock generating circuitry for generating an internal clock signal in synchronization with said external clock signal when activated, said clock generating circuitry including a plurality of circuit blocks responsive to a plurality of activation control signals, respectively when power is up, said plurality of activation control signals controlling activation of operations pre-allotted to the respective circuit blocks; and internal circuitry operating in synchronization with said internal clock signal, for performing a predetermined operation.

10. The semiconductor device according to claim 9, wherein said plurality of circuit blocks of said clock generating circuitry includes a clock buffer for generating said internal clock signal for application to said internal circuitry when activated, and said plurality of activation control signals include a buffer activation signal for activating said clock buffer.

11. The semiconductor device according to claim 9, wherein said plurality of circuit blocks of said clock generating circuitry include a comparison circuit for comparing in phase said external clock signal and said internal clock signal when activated, and said plurality of activation control signals include a comparison activating signal for activating said comparison circuit.

12. The semiconductor device according to claim 9, wherein said plurality of circuit blocks of said clock generating circuitry include;

a clock generator for generating a clock signal synchronous with said external clock signal, and a reference current generator for generating a reference current determining an operation current of said clock generator for application to said clock generator when activated, said plurality of activation control signals include a current activating signal for activating said reference current generator.

13. The semiconductor device according to claim 9, wherein said plurality of circuit blocks of said clock generating circuitry include a clock generator for generating a clock signal synchronous with said external clock signal when activated, and said plurality of activation control signals include a clock activating signal for activating said clock generator.

14. A semiconductor device operating in synchronization with an external clock signal, comprising:

clock synchronization circuitry for generating an internal clock signal synchronous with said external clock signal, said clock synchronization circuitry including a circuit block kept in an inactive state in response to an operation instruction signal instructing a predetermined mode of operation; and internal circuitry operating in synchronization with said internal clock signal, for performing a prescribed operation, said circuit block inactivating said internal clock signal to stop a clock synchronous operation synchronous with said internal clock signal of said internal circuitry when kept in the inactive state in said predetermined mode of operation.

15. The semiconductor device according to claim 14, wherein said internal circuitry includes a memory array including a plurality of memory cells each having storage data refreshed at predetermined intervals, and said operation instructing signal instructs a refresh mode for internally refreshing the storage data of the memory cells.

16. The semiconductor device according to claim 14, wherein said operation instructing signal instructs an operation mode of reducing a current consumption in said semiconductor device, and said clock synchronization circuitry holds said internal clock signal in an inactive state while performing a synchronization operation on said external clock signal in response to said operation instructing signal.

17. The semiconductor device according to claim 14, wherein said operation instructing signal instructs an operation mode of reducing a consumed current in said semiconductor device, and said clock synchronization circuitry further includes a clock generator for generating a first clock signal in synchronization with said external clock signal, said clock generator reducing a frequency of said first clock signal reduced relative to said external clock signal in response to said operation instructing signal.

18. The semiconductor device according to claim 17, wherein the circuit block of said clock synchronization circuitry includes a clock buffer receiving said first clock signal to generate said internal clock signal, said clock buffer holds said internal clock signal in an inactive state in response to said operation instructing signal.

19. The semiconductor device according to claim 14, wherein said operation instructing signal instructs an operation mode of reducing a current consumption in said semiconductor device, and the circuit block of said clock synchronization circuitry comprises a part of a circuit for performing a synchronization operation on said external clock signal to generate said internal clock signal.

20. The semiconductor device according to claim 19, wherein said external clock signal is halted when said operation instructing signal is applied.

21. The semiconductor device according to claim 19, wherein said clock synchronization circuitry performs the synchronization operation on said external clock signal in response to a first operation activation signal to generate said internal clock signal synchronous with said external clock signal and then said operation instructing signal is applied to inactivate said part of the circuit.

* * * * *